United States Patent
Zhang et al.

(10) Patent No.: US 12,119,350 B2
(45) Date of Patent: Oct. 15, 2024

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventors: Kui Zhang, Hefei (CN); Xin Li, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 493 days.

(21) Appl. No.: 17/449,493

(22) Filed: Sep. 30, 2021

(65) Prior Publication Data
US 2022/0310596 A1 Sep. 29, 2022

Related U.S. Application Data

(63) Continuation of application No. PCT/CN2021/112012, filed on Aug. 11, 2021.

(30) Foreign Application Priority Data

Mar. 29, 2021 (CN) .......................... 202110336399.0

(51) Int. Cl.
*H01L 27/092* (2006.01)
*H01L 21/02* (2006.01)
(Continued)

(52) U.S. Cl.
CPC ...... *H01L 27/0922* (2013.01); *H01L 21/0259* (2013.01); *H01L 21/823807* (2013.01);
(Continued)

(58) Field of Classification Search
CPC ............. H01L 27/0922; H01L 21/0259; H01L 21/823807; H01L 21/823878;
(Continued)

(56) References Cited

U.S. PATENT DOCUMENTS 5,612,563 A * 3/1997 Fitch ................ H01L 21/76897
257/E29.267
7,244,643 B2 7/2007 Ishitsuka
(Continued)

FOREIGN PATENT DOCUMENTS

CN 1592969 A 3/2005
CN 101090121 A 12/2007
(Continued)

OTHER PUBLICATIONS

Will CFET be the transistor of choice of the future, Semiconductor Industry Watch, May 28, 2020, http://news.moore.ren/industry/225676.htm.

*Primary Examiner* — Tong-Ho Kim
(74) *Attorney, Agent, or Firm* — Syncoda LLC; Feng Ma

(57) ABSTRACT

A semiconductor structure includes a base and conductive channel structure which includes first and second conductive channel layers and conductive buffer layer. The first conductive channel layer includes a first conductive channel, first and second doped regions on both sides of the first conductive channel; the second conductive channel layer includes a second conductive channel and third and fourth doped regions on both sides of the second conductive channel; the conductive buffer layer reduces electrical interference between the first and third doped regions. The semiconductor structure further includes a first wire layer disposed on the base extending in a direction and in contact with the second doped region; a second wire layer extending in another direction and in contact with the first and third doped regions; and a gate structure disposed around the first and second conductive channels.

19 Claims, 16 Drawing Sheets

(51) Int. Cl.
*H01L 21/8238* (2006.01)
*H01L 29/06* (2006.01)
*H01L 29/423* (2006.01)
*H01L 29/66* (2006.01)
*H01L 29/786* (2006.01)

(52) U.S. Cl.
CPC .. *H01L 21/823878* (2013.01); *H01L 29/0665* (2013.01); *H01L 29/42392* (2013.01); *H01L 29/66742* (2013.01); *H01L 29/78696* (2013.01)

(58) Field of Classification Search
CPC .......... H01L 29/0665; H01L 29/42392; H01L 29/66742; H01L 29/78696; H01L 29/66439; H01L 21/823871; H01L 21/823828; H01L 29/0676; H01L 29/775; H01L 21/823885; H01L 27/092; H01L 29/66666; H01L 29/7827; H01L 29/78642; B82Y 10/00
USPC ........................................................ 257/351
See application file for complete search history.

(56) References Cited

U.S. PATENT DOCUMENTS

| | | | |
|---|---|---|---|
| 7,723,807 | B2 | 5/2010 | Nishiyama |
| 7,906,435 | B2 | 3/2011 | Nishiyama |
| 8,036,036 | B2 | 10/2011 | Nishiyama |
| 8,878,279 | B2 | 11/2014 | Koval |
| 9,196,625 | B2 | 11/2015 | Koval |
| 9,443,864 | B2 | 9/2016 | Koval |
| 9,472,551 | B2 | 10/2016 | Oxland |
| 9,698,022 | B2 | 7/2017 | Koval |
| 9,831,131 | B1 | 11/2017 | Jacob |
| 9,953,882 | B2 | 4/2018 | Jacob |
| 9,997,463 | B2 | 6/2018 | Zhang |
| 10,049,946 | B2 | 8/2018 | Oxland |
| 10,115,438 | B2 | 10/2018 | Ingalls et al. |
| 10,115,641 | B2 | 10/2018 | Zhu |
| 10,339,985 | B2 | 7/2019 | Ingalls et al. |
| 10,580,464 | B2 | 3/2020 | Ingalls et al. |
| 10,629,538 | B2 | 4/2020 | Zhang |
| 10,944,012 | B2 | 3/2021 | Reznicek et al. |
| 11,081,484 | B2 | 8/2021 | Zhu et al. |
| 11,081,546 | B2 | 8/2021 | Li et al. |
| 2005/0121727 | A1 | 6/2005 | Ishitsuka |
| 2007/0290232 | A1 | 12/2007 | Nishiyama |
| 2010/0027338 | A1 | 2/2010 | Nishiyama |
| 2010/0203728 | A1 | 8/2010 | Nishiyama |
| 2014/0160841 | A1 | 6/2014 | Koval |
| 2015/0187785 | A1 | 7/2015 | Koval |
| 2015/0364486 | A1 | 12/2015 | Koval |
| 2016/0240533 | A1 | 8/2016 | Oxland |
| 2017/0005106 | A1 | 1/2017 | Zhang |
| 2017/0011928 | A1 | 1/2017 | Koval |
| 2017/0033021 | A1 | 2/2017 | Oxland |
| 2018/0061460 | A1 | 3/2018 | Ingalls et al. |
| 2018/0090387 | A1 | 3/2018 | Jacob |
| 2018/0096896 | A1 | 4/2018 | Zhu |
| 2018/0097065 | A1 | 4/2018 | Zhu |
| 2018/0097106 | A1 | 4/2018 | Zhu |
| 2018/0108577 | A1 | 4/2018 | Zhu et al. |
| 2018/0294015 | A1 | 10/2018 | Ingalls et al. |
| 2018/0337133 | A1 | 11/2018 | Zhang |
| 2019/0206736 | A1* | 7/2019 | Sills .................. H01L 21/8221 |
| 2019/0287579 | A1 | 9/2019 | Ingalls et al. |
| 2019/0287865 | A1 | 9/2019 | Zhu et al. |
| 2019/0378854 | A1 | 12/2019 | Lee et al. |
| 2020/0203343 | A1 | 6/2020 | Zhu et al. |
| 2020/0212226 | A1 | 7/2020 | Reznicek et al. |
| 2020/0280700 | A1 | 9/2020 | Zhu |
| 2020/0335581 | A1 | 10/2020 | Li et al. |
| 2020/0350326 | A1 | 11/2020 | Yun et al. |
| 2021/0036146 | A1 | 2/2021 | Zhou |
| 2021/0296316 | A1 | 9/2021 | Zhu |
| 2021/0305364 | A1 | 9/2021 | Li et al. |
| 2022/0102492 | A1* | 3/2022 | Gardner .......... H01L 21/823842 |

FOREIGN PATENT DOCUMENTS

| | | |
|---|---|---|
| CN | 105895635 A | 8/2016 |
| CN | 106252352 A | 12/2016 |
| CN | 106298792 A | 1/2017 |
| CN | 106449596 A | 2/2017 |
| CN | 109196584 A | 1/2019 |
| CN | 109449158 A | 3/2019 |
| CN | 109830483 A | 5/2019 |
| CN | 109841675 A | 6/2019 |
| CN | 110808247 A | 2/2020 |
| CN | 111883534 A | 11/2020 |
| CN | 112309860 A | 2/2021 |
| CN | 112310042 A | 2/2021 |
| CN | 113078154 A | 7/2021 |
| CN | 113078155 A | 7/2021 |
| CN | 113078156 A | 7/2021 |
| JP | 2007059680 A | 3/2007 |
| JP | 2007250652 A | 9/2007 |

* cited by examiner

SEMICONDUCTOR STRUCTURE AND METHOD FOR FORMING SEMICONDUCTOR STRUCTURE

CROSS-REFERENCE TO RELATED APPLICATIONS

This is a continuation of International Patent Application No. PCT/CN2021/112012 filed on Aug. 11, 2021, which claims priority to Chinese Patent Application No. 202110336399.0 filed on Mar. 29, 2021. The disclosures of these applications are hereby incorporated by reference in their entirety.

BACKGROUND

The process and performance of integrated circuit chips are closely related to the structure of transistor devices. At technology nodes below 5 nm, the drawbacks of MOS field-effect transistor devices based on the PN junction theory are even more apparent: the channel length of the device continues to shrink, and the distance between the source and drain is getting closer and closer.

SUMMARY

The present disclosure relates to, but is not limited to, a semiconductor structure and a method for forming the semiconductor structure.

According to some embodiments, the first aspect of the embodiments of the present disclosure provides a semiconductor structure, which includes a base, and a conductive channel structure on the base that includes a first conductive channel layer, a conductive buffer layer, and a second conductive channel layer stacked in sequence; the first conductive channel layer includes a first conductive channel, a first doped region and a second doped region on both sides of the first conductive channel, wherein the first doped region is close to the second conductive channel layer; the second conductive channel layer includes a second conductive channel, and a third doped region and a fourth doped region on both sides of the second conductive channel, wherein the third doped region is close to the first conductive channel layer; the conductive buffer layer is configured to reduce electrical interference between the first doped region and the third doped region; the semiconductor structure further includes: a first wire layer disposed on the base, extending in a first direction, and in contact with the second doped region in the first direction; a second wire layer, extending in a second direction, and in contact with the first doped region and the third doped region in the second direction; and a gate structure, disposed around the first conductive channel and the second conductive channel.

According to some embodiments, the embodiments of the present disclosure also provide a method for forming a semiconductor structure, which includes: providing a base including a structure region and a wiring region, wherein the base includes a substrate, a first wire layer which extends in a first direction and an isolation layer; forming a first sacrificial layer on the base in the structure region, and forming a peripheral insulating structure on the base in the wiring region; patterning the first sacrificial layer to form a first channel penetrating through the first sacrificial layer; forming a second wire layer which fills the first channel and is partially disposed on the first sacrificial layer, extends into the peripheral insulating structure of the wiring region, and extends in the second direction; sequentially forming a second sacrificial layer and a protective layer on the base in the structure region; patterning the second sacrificial layer to form a second channel penetrating through the second sacrificial layer, and the projections of the first channel and the second channel on the base overlap with each other; forming a second conductive channel layer filling the second channel; patterning a part of the protective layer to expose the second sacrificial layer, and removing the second sacrificial layer and the first sacrificial layer; and forming a gate structure which fills a gap between a plane where the first wire layer is disposed and a plane where the second wire layer is disposed.

According to some embodiments, the embodiments of the present disclosure further provide a method for forming a semiconductor structure, which includes: providing a base including a structure region and a wiring region, wherein the base includes a substrate, a first wire layer which extends in a first direction and an isolation layer; forming a first sacrificial layer on the base in the structure region, and forming a peripheral insulating structure on the base in the wiring region; forming a second wire layer which extends into the peripheral insulating structure of the wiring region and extends in the second direction on first sacrificial layer; sequentially forming a second sacrificial layer and a protective layer on the base in the structure region; patterning the protective layer, the second sacrificial layer and the first sacrificial layer to form an opening, and filling the opening to form a conductive channel structure; patterning a part of the protective layer to expose the second sacrificial layer, and removing the second sacrificial layer and the first sacrificial layer; and forming a gate structure which fills a gap between a plane where the first wire layer is disposed and a plane where the second wire layer is disposed.

DETAILED DESCRIPTION

Figure 1:
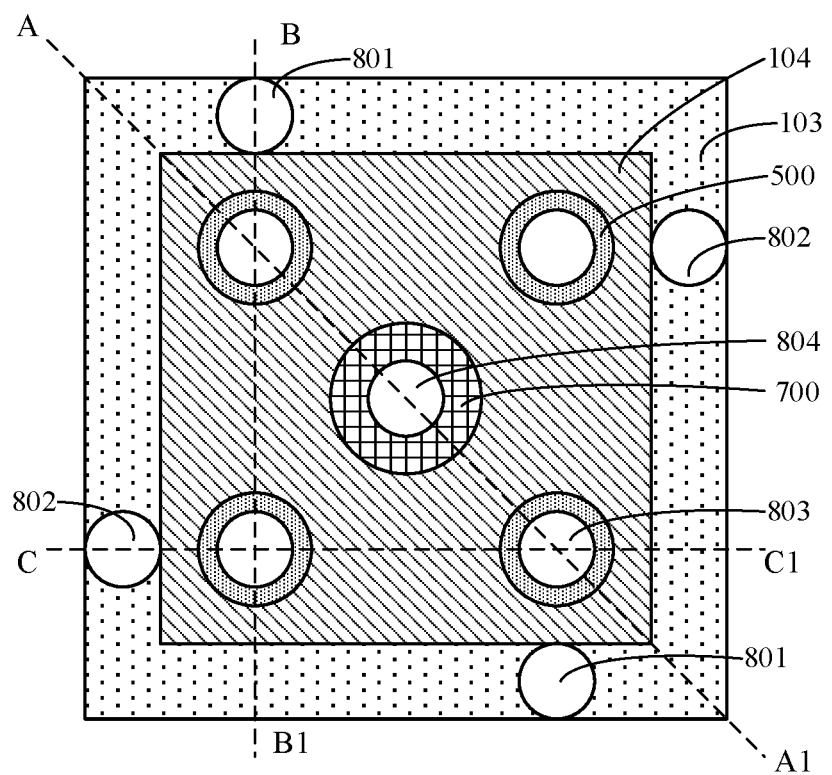
FIG. 1 illustrates a schematic cross-sectional view of a semiconductor structure provided by an embodiment of the present disclosure.

In order to prevent source-drain punch-through, an ultra-steep source-drain concentration gradient doping process can be adopted, which will severely limit the thermal budget of the device process. In addition, due to the statistical distribution of doping atoms and the natural properties of doping atoms that are easy to diffuse at a certain temperature, it becomes extremely difficult to fabricate ultra-steep PN junctions in the nanometer range, resulting in serious short-channel effects, resulting in a decrease in the threshold voltage of the transistor. The gate control ability of the device deteriorates, the leakage current increases, and the power consumption increases. In severe cases, the device cannot even be turned off.

One or more pairs of nFET and pFET cylindrical nanowire or nanosheet (or Nanoribbon) channels are stacked vertically and crossed together to form a complementary fully enclosed gate cylindrical nanowire or nanosheet field effect transistor (CFET) device structure. In the CFET device structure, nFET and pFET share a gate electrode as a signal input terminal, share a drain as a signal output terminal, and the source electrode is grounded and power supply respectively. The device size can be flexibly adjusted to meet the performance requirements of different chips. While preserving the electrical integrity of the vertically stacked nanowires or nanosheets fully enclosed gate field effect transistors, the chip area is greatly saved, the device driving current is enhanced, and the chip device integration is improved.

While CFET enhances the device drive current, it also greatly saves chip area and improves chip device integration. However, because pFET and nFET share a source or drain connection and the preparation process is complex and changeable and difficult to control, the current nFET or pFET adopts horizontally placed GAA transistors, and the horizontally disposed conductive channel occupies a lot in the horizontal direction, which limits the development of CFETs.

An embodiment of the present disclosure provides a semiconductor structure, which includes: a base, and a conductive channel structure on the base that includes a first conductive channel layer, a conductive buffer layer, and a second conductive channel layer stacked in sequence; the first conductive channel layer includes a first conductive channel, a first doped region and a second doped region on both sides of the first conductive channel, wherein the first doped region is close to the second conductive channel layer; the second conductive channel layer includes a second conductive channel, and a third doped region and a fourth doped region on both sides of the second conductive channel, wherein the third doped region is close to the first conductive channel layer; the conductive buffer layer is configured to reduce electrical interference between the first doped region and the third doped region; the semiconductor structure further includes: a first wire layer disposed on the base, extending in a first direction, and in contact with the second doped region in the first direction; a second wire layer, extending in a second direction, and in contact with the first doped region and the third doped region in the second direction; and a gate structure, disposed around the first conductive channel and the second conductive channel.

In order to make the objectives, technical solutions, and advantages of the embodiments of the present disclosure clearer, the various embodiments of the present disclosure will be described in detail below with reference to the accompanying drawings. However, those skilled in the art can understand that in each embodiment of the present disclosure, many technical details are proposed for the reader to better understand the present disclosure. However, even without these technical details and various changes and modifications based on the following embodiments, the technical solution claimed in the present disclosure can be realized. The following divisions of the various embodiments are for convenience of description, and should not constitute any limitation on the specific implementation manners of the present disclosure, and the various embodiments may be combined and referenced to each other under the premise of no contradiction.

Figure 2:
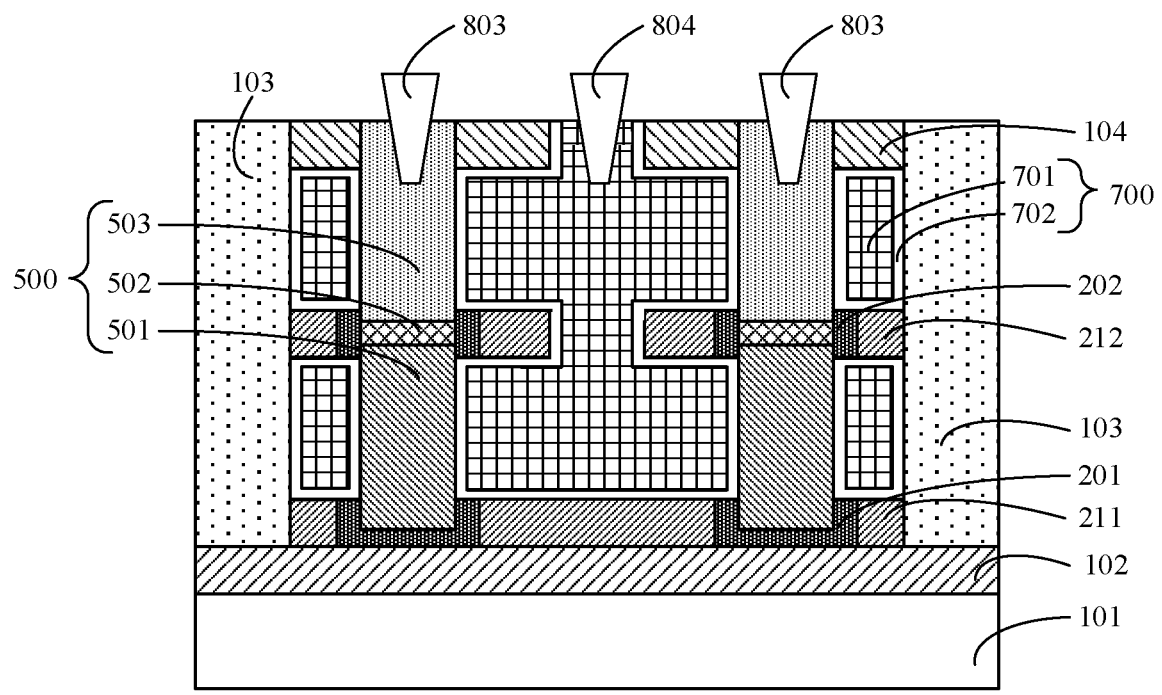
FIG. 2 illustrates a schematic cross-sectional view of a semiconductor structure in the AA1 direction provided by an embodiment of the present disclosure.
Figure 3:
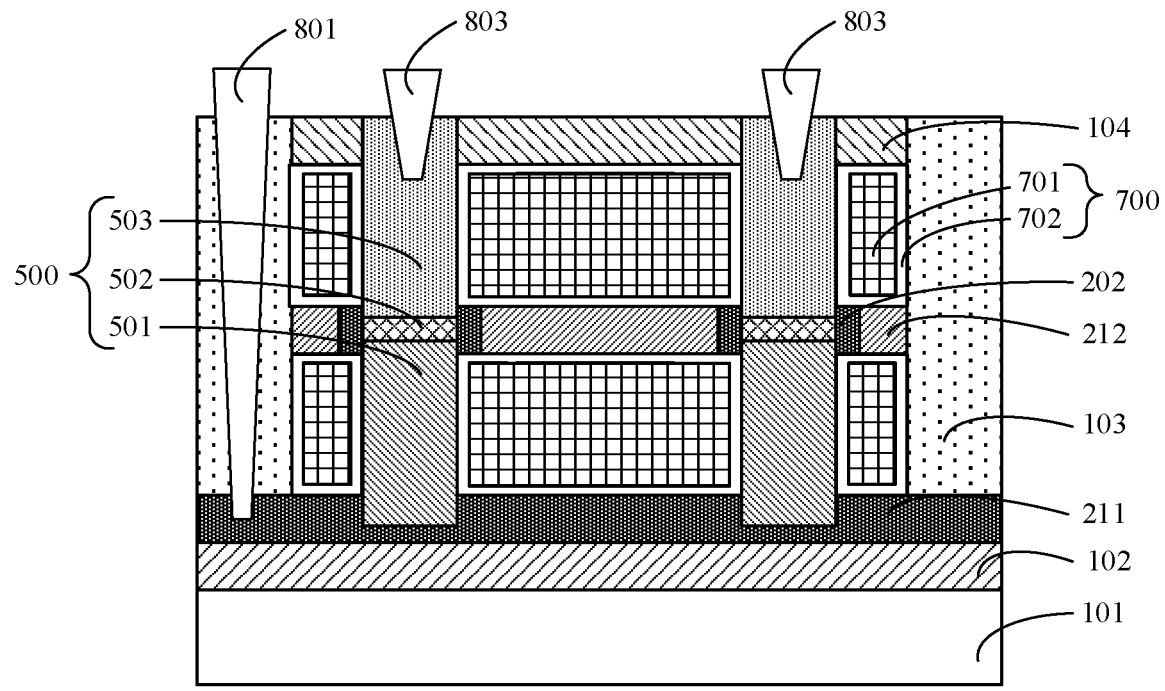
FIG. 3 illustrates a schematic cross-sectional view of a semiconductor structure in the BB1 direction provided by an embodiment of the present disclosure.
Figure 4:
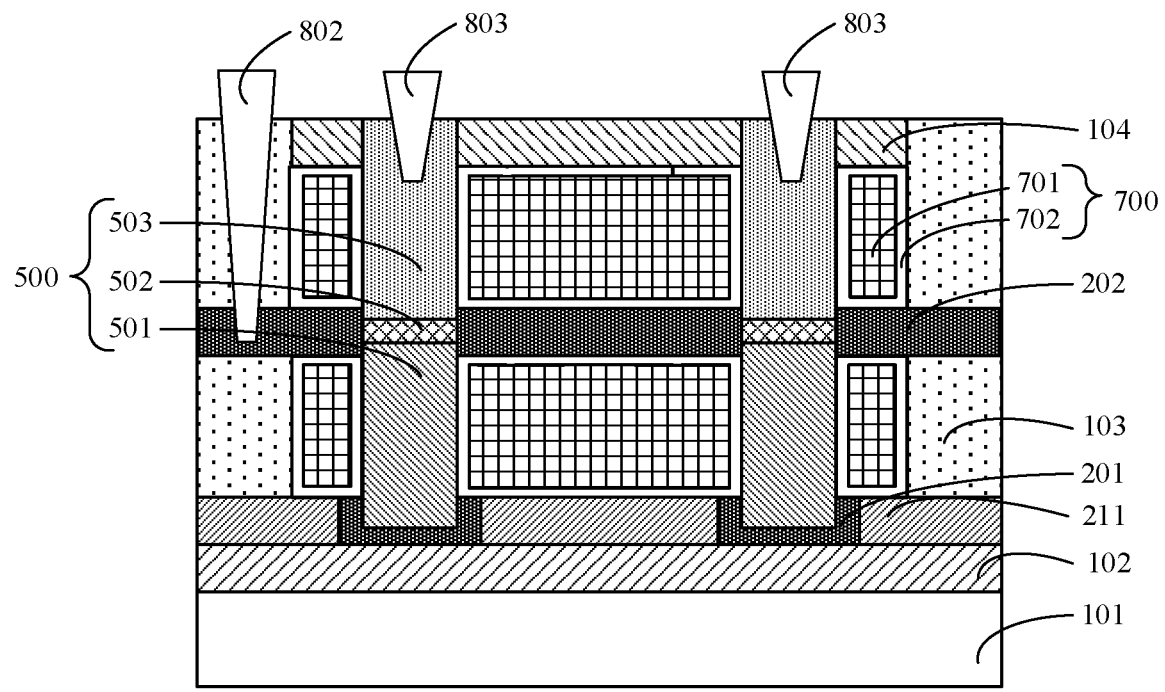
FIG. 4 illustrates a schematic cross-sectional view of a semiconductor structure in the CC1 direction provided by an embodiment of the present disclosure.
Figure 5:
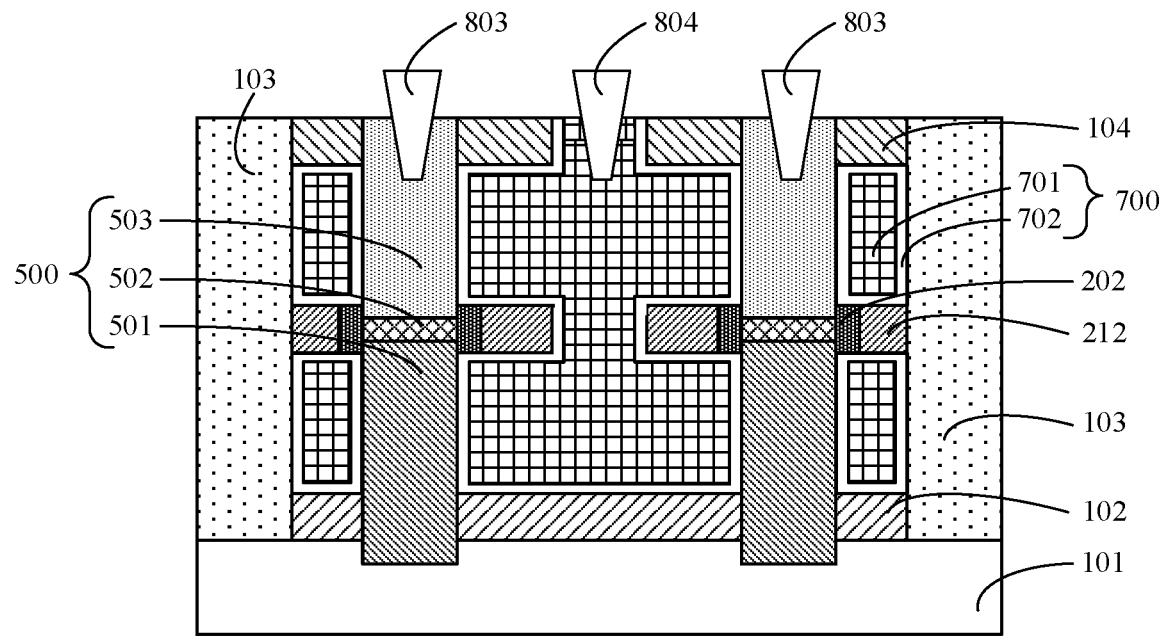
FIG. 5 illustrates a schematic cross-sectional view of another AA1 direction of the semiconductor structure provided by an embodiment of the present disclosure.
Figure 6:
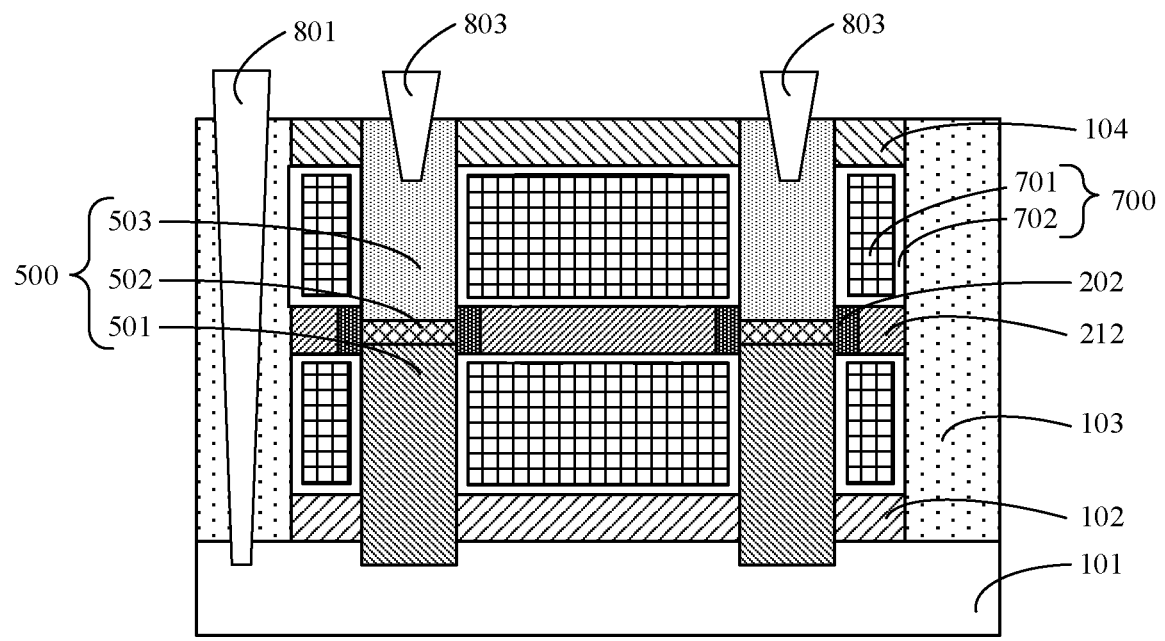
FIG. 6 illustrates a schematic cross-sectional view of another semiconductor structure in the BB1 direction provided by an embodiment of the present disclosure
Figure 7:
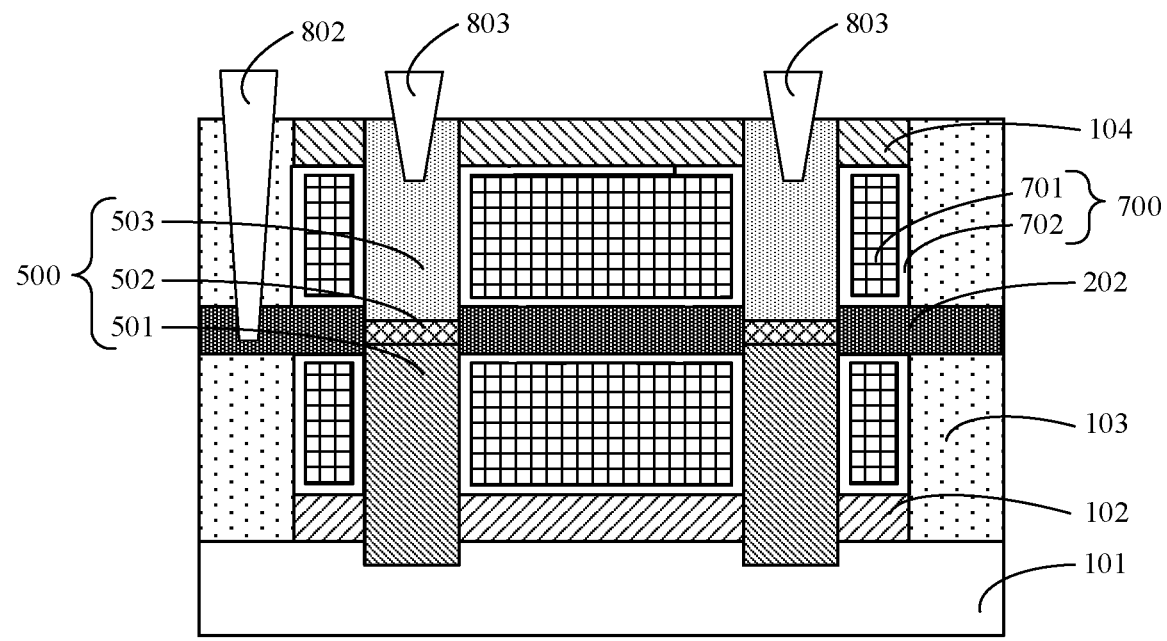
FIG. 7 illustrates a schematic cross-sectional view of another CC1 direction of a semiconductor structure provided by an embodiment of the present disclosure.

FIG. 1 illustrates a schematic cross-sectional view of a semiconductor structure provided by an embodiment of the present disclosure, FIG. 2 illustrates a schematic cross-sectional view of a semiconductor structure in the AA1 direction provided by an embodiment of the present disclosure, FIG. 3 illustrates a schematic cross-sectional view of a semiconductor structure in the BB1 direction provided by an embodiment of the present disclosure, FIG. 4 illustrates a schematic cross-sectional view of a semiconductor structure in the CC1 direction provided by an embodiment of the present disclosure, FIG. 5 illustrates a schematic cross-sectional view of another AA1 direction of the semiconductor structure provided by an embodiment of the present disclosure, FIG. 6 illustrates a schematic cross-sectional view of another semiconductor structure in the BB1 direction provided by an embodiment of the present disclosure, and FIG. 7 illustrates a schematic cross-sectional view of another CC1 direction of a semiconductor structure provided by an embodiment of the present disclosure, the semiconductor structure provided in this embodiment will be described in further detail below with reference to the accompanying drawings.

With reference to FIGS. 1-7, the semiconductor structure includes:

a base (not denoted), and a conductive channel structure 500 on the base (not denoted) that includes a first conductive channel layer 501, a conductive buffer layer 502, and a second conductive channel layer 503 stacked in sequence.

It is be noted that there may be one or more conductive channel structures 500 on the base, and a plurality of conductive channel structures 500 are separately disposed on the base (not denoted); referring to FIG. 1, this embodiment takes four conductive channel structures 500 disposed on the base as an example for specific description, which do not constitute a limitation to this embodiment. In other embodiments, the conductive channel structures may be 1, 3, 5, etc.; in specific applications, the number of the conductive channels structures 500 can be specifically set according to requirements. In addition, in this embodiment, the four conductive channel structures 500 are disposed in a square arrangement.

Specifically, one of the first conductive channel layer 501 and the second conductive channel layer 503 is an N-type conductive channel, and the other is a P-type conductive channel. In this embodiment, the first conductive channel layer 501 is made as an N-type conductive channel, and the second conductive channel layer 503 is made as a P-type conductive channel as an example for detailed description, which does not constitute a limitation of this embodiment; in other embodiments, the first conductive channel layer is made as a P-type conductive channel, and the second conductive channel layer is made as an N-type conductive channel as an example for detailed description.

The first conductive channel layer 501 includes a first conductive channel (not denoted), a first doped region (not denoted) and a second doped region (not denoted) on both sides of the first conductive channel (not denoted), wherein the first doped region (not denoted) is close to the second conductive channel layer 503.

Specifically, the first conductive channel layer 501 is formed by in-situ doping or deposition followed by doping. The material of the first conductive channel layer 501 is an N-type semiconductor material formed by doping single crystal silicon with a group VA element. Herein, the doping concentration at both ends of the first conductive channel layer 501 is greater than the intermediate doping concentration, thereby forming a first doped region (not denoted) and a second doped region (not denoted). In this embodiment, the second doped region (not denoted) is close to the base (not denoted), and the first doped region (not denoted) is close to the second conductive channel layer 503 as an example for detailed description, which does not constitute a limitation to this embodiment; in other embodiments, the first doped region may be close to the base, and the second doped region may be close to the second conductive channel layer.

The second conductive channel layer 503 includes a second conductive channel (not denoted), and a third doped region (not denoted) and a fourth doped region (not denoted) on both sides of the second conductive channel (not denoted), wherein the third doped region (not denoted) is close to the first conductive channel layer 501.

Specifically, the second conductive channel layer 503 is formed by in-situ doping or deposition followed by doping. The material of the first conductive channel layer 503 is an P-type semiconductor material formed by doping single crystal silicon with a group IIIA element. Herein, the doping concentration at both ends of the second conductive channel layer 503 is greater than the intermediate doping concentration, thereby forming a third doped region (not denoted) and a fourth doped region (not denoted). In this embodiment, the fourth doped region (not denoted) is away form the base (not denoted), and the third doped region (not denoted) is close to the first conductive channel layer 501 as an example for detailed description, which does not constitute a limitation to this embodiment; in other embodiments, the third doped region may be away from the base, and the fourth doped region may be close to the first conductive channel layer.

The conductive buffer layer 502 is disposed between the first conductive channel layer 501 and the second conductive channel layer 503 for reducing electrical interference between the first doped region (not denoted) and the third doped region (not denoted). In an example, the material of the conductive buffer layer 502 is polysilicon, and the conductive buffer layer 502 reduces the dielectric constant between the first doped region (not denoted) and the third doped region (not denoted), thereby preventing the problem of electrical interference between the doped region (not denoted) and the third doped region (not denoted).

Also referring to FIGS. 1-7, a first wire layer is disposed on the base (not denoted), extends in a first direction, and is in contact with the second doped region (not denoted) in the first direction. In this embodiment, the material of the first wire layer is a semiconductor conductive material or a metal conductive material such as tungsten.

In this embodiment, the first direction is described as the arrangement in the BB1 direction, which does not constitute a limitation to this embodiment. In other embodiments, the extension direction of the first wire layer can be determined according to specific requirements.

Additionally, the first wire layer is in contact with the second doped regions (not denoted) in all of the conductive channel structures 500 disposed in the first direction. Specifically, the first wire layer is in contact with the second doped regions (not denoted) of the two conductive channel structures 500 disposed in the first direction at the same time, and is configured to derive the electrical signals of the second doped regions (not denoted) in the two conductive channel structures 500.

Specifically, this embodiment provides two implementation manners of the first wire layer, which are specifically as follows:

In an example, with reference to FIGS. 2-4, the base (not shown) includes a substrate 101 and an isolation layer 102, the isolation layer 102 is disposed on a top surface of the substrate 101, and the first wire layer 201 is disposed on a top surface of the isolation layer 102. In this embodiment, the base further includes a first barrier layer 211, which is disposed on the plane where the first wire layer 201 is disposed, and is formed of an insulating material to improve the stability of the semiconductor structure.

In another example, with reference to FIGS. 5-7, the base (not denoted) includes a substrate 102 where the first wire layer (not denoted) is disposed, and an isolation layer 102 which is disposed on the top surface of the substrate 101, the first conductive channel layer 501 penetrates the isolation layer 102 and a part of the substrate 101, so that the second doped region (not denoted) is in contact with the first wire layer (not denoted).

In the above two examples, the material of the substrate 101 includes silicon, silicon carbide, gallium arsenide, etc.; in this embodiment, the substrate 101 is formed of silicon material. The silicon material is used as the substrate 101 in this embodiment to facilitate the understanding of subsequent forming methods by those skilled in the art and does not constitute a limitation. In the actual application process, a suitable material of the substrate 101 can be selected according to requirements; in addition, the material of the isolation layer 102 is silicon nitride.

Also referring to FIGS. 1-7, the second wire layer 202 is nested and disposed on the conductive channel structure 500 and is in contact with the first doped region (not denoted) and the third doped region (not denoted) in the second direction. In this embodiment, the material of the second wire layer 202 is a semiconductor conductive material or a metal conductive material such as tungsten.

In this embodiment, the base further includes a second barrier layer 212, which is disposed on the plane where the second wire layer 202 is disposed, and is formed of an insulating material to improve the stability of the semiconductor structure.

Specifically, in this embodiment, the extension angle between the first direction and the second direction is greater than 0 degree, that is, the first direction and the second direction do not overlap with each other, and there is an angle between the first direction and the second direction, so that subsequent electrical connections to the first wire layer 201 and the second wire layer 202 can be realized at different positions.

In this embodiment, the description is made in a manner that the second direction is disposed in the CC1 direction, that is, the first direction and the second direction are perpendicular to each other, which does not constitute a limitation to this embodiment. In other embodiments, according to specific requirements, the extension direction of the second wire layer 202 can be determined, when there is an angle between the first wire layer 201 and the second wire layer 202, which should fall within the protection scope of the present application.

Specifically, the second wire layer 202 is in contact with the first doped regions (not denoted) and the third doped regions (not denoted) in all of the conductive channel structures 500 disposed in the second direction. Specifically, the second wire layer 202 is in contact with the first doped regions (not denoted) and the third doped regions (not denoted) of the two conductive channel structures 500 disposed in the second direction at the same time, for deriving the electrical signals of the first doped regions (not denoted) and the third doped regions (not denoted) in the two conductive channel structures 500.

Furthermore, in the direction perpendicular to the surface of the base (not denoted), the second barrier layer 212 has sub-connection holes penetrating the second barrier layer 212 (refer to FIG. 2 or FIG. 5).

In this embodiment, the height of the contact surface between the conductive buffer layer 502 and the first doped region (not denoted) is lower than the height of the central thickness position of the second wire layer 202, and is higher than the height of the bottom surface of the second wire layer 202; and the height of the contact surface between the conductive buffer layer 502 and the third doped region (not denoted) is higher than the height of the central thickness position of the second wire layer 202 and lower than the height of the top surface of the second wire layer 202. By limiting the thickness of the second wire layer 202, the second wire layer 202 has a larger contact area with the first doped region (not denoted) and the third doped region (not denoted), thereby ensuring the stability of the electrical connection between the second wire layer 202 and the first doped region (not denoted) as well as the third doped region (not denoted).

Furthermore, the thickness of the conductive buffer layer 502 is less than ⅓ of the thickness of the second wire layer. By limiting the thickness of the conductive buffer layer 502, the second wire layer 202 has a larger contact area with the first doped region (not denoted) and the third doped region (not denoted), thereby ensuring the stability of the electrical connection between the second wire layer 202 and the first doped region (not denoted) as well as the third doped region (not denoted).

Also referring to FIGS. 1 to 7, the gate structure 700 is disposed around the first conductive channel (not denoted) and the second conductive channel (not denoted).

Specifically, the gate structure 700 includes a gate oxide layer 702 and a metal gate layer 701. The gate oxide layer covers the first conductive channel, the second conductive channel, and the first wire layer 201 (refer to FIGS. 2 to 4) rr the isolation layer 102 (refer to FIG. 5 to FIG. 7) and the surface exposed by the second wire layer 202; the metal gate layer 701 is configured to fill the gap between the gate oxide layers 702, thereby forming the gate structure 700.

In an example, in order to prevent electrical crosstalk between the first wire layer 201 as well as the second wire layer 202 and the gate structure 700, the semiconductor structure further includes: a first insulating layer (not illustrated) disposed around the first wire layer 201, and a second insulating layer (not illustrated) disposed around the second wire layer 202.

In another example, in order to protect the top surface of the gate structure 700, the semiconductor structure further includes: a protective layer 104 that is nested on the top of all of the separate conductive channel structures 500, in contact with the fourth doped region (not denoted), and having vias (refer to FIGS. 2 and 5) penetrating the protective layer 104 in a direction perpendicular to the surface of the base (not denoted) and filled with the gate structure 700.

In other embodiments, if there is no first barrier layer to fill the plane where the first wire layer is disposed, and no second barrier layer to fill the plane where the second wire layer is disposed, the gate structure also fills the gap between the plane where the first wire layer is disposed and the plane where the second wire layer is disposed.

Specifically, the top surface of the protection layer 104 is aligned with the top surface of the second conductive channel layer 503 to facilitate subsequent electrical signal extraction and packaging of the semiconductor structure.

Also referring to FIGS. 1-7, the base (not denoted) of the semiconductor structure includes a structure region and a wiring region. The wiring region is provided on the periphery of the structure region; the base (not shown) of the wiring region is provided with a peripheral insulating structure 103, the first wire layer 201 and the second wire layer 202 also extend into the peripheral insulating structure 103 of the wiring region on one side for subsequent electrical connection of the first wire layer 201 and the second wire 202 through the wiring region.

Specifically, in this embodiment, the first conductive plug 801 is electrically connected to the first wire layer 201, the second conductive plug 802 is electrically connected to the second wire 202, and the third conductive plug 803 is electrically connected to the fourth doped region (not denoted), the fourth conductive plug 804 is electrically connected to the gate structure 700, which is specifically as follows:

If the first wire layer 201 and the substrate 101 are disposed separately, referring to FIG. 2 and FIG. 3, the first conductive plug 801 penetrates the peripheral insulating structure 103 and is electrically connected to the first wire layer 201. Further, the first conductive plug 801 also penetrates a part of the first wire layer 201 to increase the contact area between the first conductive plug 801 and the first wire layer 201, thereby reducing the contact resistance between the first conductive plug 801 and the first wire layer 201.

If the first wire layer is disposed in the substrate 101, referring to FIGS. 4 and 5, the first conductive plug 801 penetrates the peripheral insulating structure 103 and the isolation layer 102, and is electrically connected to the first wire layer in the substrate 101. Furthermore, the first conductive plug 801 also penetrates a part of the substrate 101 and the first wire layer to increase the contact area between the first conductive plug 801 and the first wire layer, thereby reducing the contact resistance between the first conductive plug 801 and the first wire layer.

The second conductive plug 802 penetrates a part of the peripheral insulating structure 103 and is in contact with the second wire 202. Furthermore, the second conductive plug 802 also penetrates a part of the second wire 202 to increase the contact area between the second conductive plug 802 and the second wire 202, thereby reducing the contact resistance between the second conductive plug 802 and the second wire 202.

The third conductive plug 803 is in contact with the fourth doped region (not denoted). Furthermore, the third conductive plug 803 also penetrates a part of the fourth doped region (not denoted) to increase the contact area between the third conductive plug 803 and the fourth doped region (not denoted), thereby reducing the contact resistance between the third conductive plug 803 and the fourth doped region (not denoted).

The fourth conductive plug 804 is in contact with the top of the gate structure 700. Furthermore, the fourth conductive plug 804 also penetrates a part of the gate structure 700 to increase the contact area between the fourth conductive plug 804 and the gate structure 700, thereby reducing the contact resistance between the fourth conductive plug 804 and the gate structure 700.

Compared with the related art, the vertically disposed first conductive channel layer and the second conductive channel layer, that is, the vertically disposed two conductive channels, the conductive channels are disposed vertically, and the gate structure surrounds the first conductive channel and the second conductive channel in the horizontal direction, so as to prevent the conductive channel from occupying a large area in the horizontal direction.

Another embodiment of the present disclosure relates to a method for forming a semiconductor structure, which includes: providing a base including a structure region and a wiring region, wherein the base includes a substrate, a first wire layer which extends in a first direction and an isolation layer; forming a first sacrificial layer on the base in the structure region, and forming a peripheral insulating structure on the base in the wiring region; forming a second wire layer which extends into the peripheral insulating structure of the wiring region and extends in the second direction on first sacrificial layer; sequentially forming a second sacrificial layer and a protective layer on the base in the structure region; patterning the protective layer, the second sacrificial layer and the first sacrificial layer to form an opening, and filling the opening to form a conductive channel structure; patterning a part of the protective layer to expose the second sacrificial layer, and removing the second sacrificial layer and the first sacrificial layer; and forming a gate structure which fills the gap.

FIGS. 8, 11, 13, 15, 17, 19, 21 and 27 illustrate schematic diagrams of top view structures corresponding to the respective steps in a method for forming a semiconductor structure provided by another embodiment of the present disclosure, FIGS. 9, 12, 14, 16, 18, 20, 22, 23 and 28 illustrate schematic diagrams of cross-sectional structures corresponding to the respective steps in a method for forming a semiconductor structure provided by another embodiment of the present disclosure, FIGS. 10, 24, 25, and 26 illustrate schematic diagrams of the cross-sectional structures corresponding to the formation of the first wire layer in the substrate according to the method for forming a semiconductor structure provided by another embodiment of the present disclosure, the method for forming the semiconductor structure provided in this embodiment will be described in detail below in combination with the accompanying drawings, and the parts that are the same as or corresponding to the above embodiments will not be described in detail below.

Figure 8:
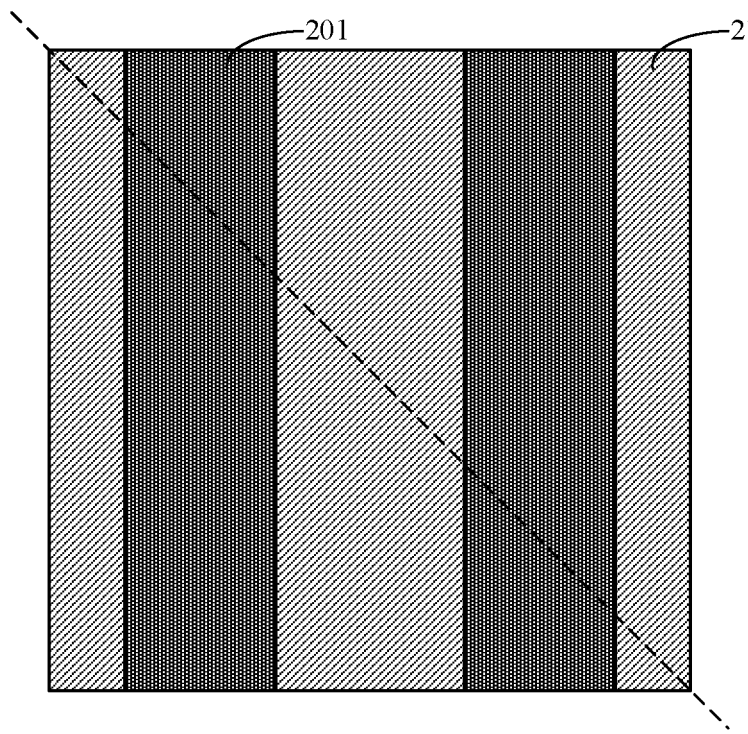
FIG. 8, FIG. 11, FIG. 13, FIG. 15, FIG. 17, FIG. 19, FIG. 21, and FIG. 27 respectively illustrate schematic diagrams of top view structures corresponding to the respective steps in a method for forming a semiconductor structure provided by another embodiment of the present disclosure.
Figure 9:
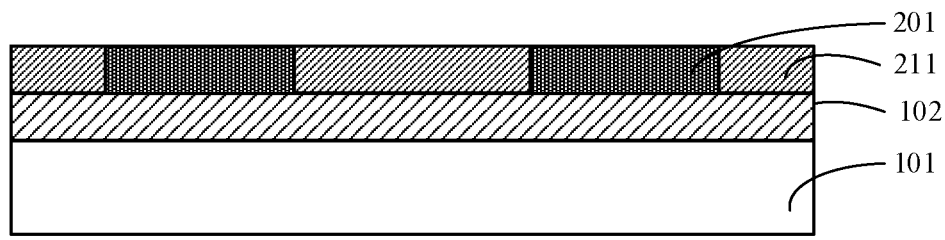
FIG. 9, FIG. 12, FIG. 14, FIG. 16, FIG. 18, FIG. 20, FIG.
Figure 10:
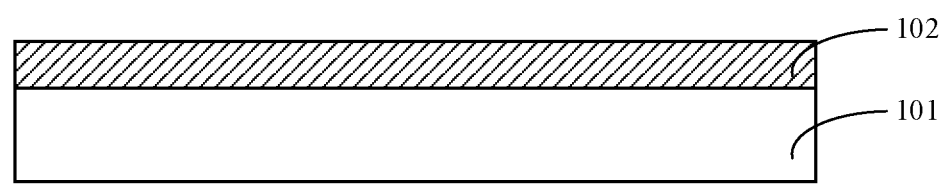
FIG. 10, FIG. 24, FIG. 25, and FIG. 26 respectively illustrate schematic diagrams of the cross-sectional structures corresponding to the formation of the first wire layer in the substrate according to the method for forming a semiconductor structure provided by another embodiment of the present disclosure.

With reference to FIGS. 8-10, a base (not denoted) including a structure region and a wiring region is provided, wherein the base includes a substrate 101, a first wire layer 201 which extends in a first direction and an isolation layer 102.

In an example, with reference to FIG. 9, providing a base (not denoted) including a structure region and a wiring region, including: providing a substrate 101 including a structure region and a wiring region, and forming an isolation layer 102 on the substrate 101 in the structure region 102, and forming a first wire layer 201 on the isolation layer 102.

It is be noted that, in this embodiment, a first barrier layer 211 is formed on the plane where the first wire layer 201 is disposed, and the first barrier layer 211 is formed of an insulating material to improve the stability of the semiconductor structure.

In another example, with reference to FIG. 10, providing a base (not denoted) that includes a structure region and a wiring region includes: providing a substrate 101 that includes a structure region and a wiring region, doping the substrate 101 in the structure region to form the first wire layer (not illustrated), and forming the isolation layer 102 on the substrate 101 in the structure region.

In this embodiment, the material of the substrate 101 includes silicon, silicon carbide, or gallium arsenide, etc.; in this embodiment, the substrate 101 is formed of silicon material. The use of silicon material as the substrate 101 in this embodiment does not constitute a limitation, but is to facilitate the understanding of subsequent formation methods by those skilled in the art. In the actual application process, a suitable material of the substrate 101 can be selected according to requirements; in addition, the material of the isolation layer 102 is silicon nitride; the first wire layer 201 is formed of a semiconductor conductive material or a metal conductive material, such as doped silicon or tungsten.

Figure 11:
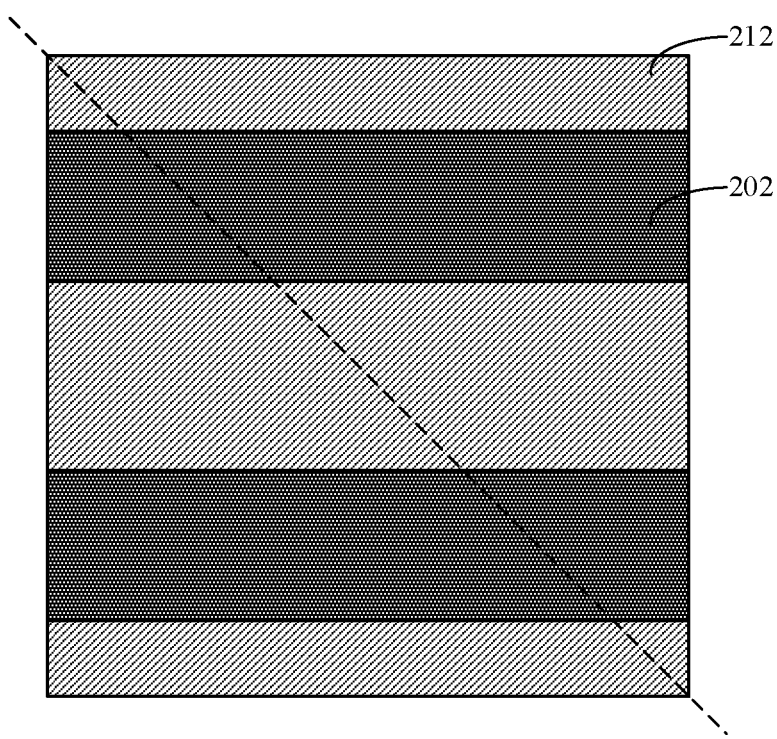
Figure 12:
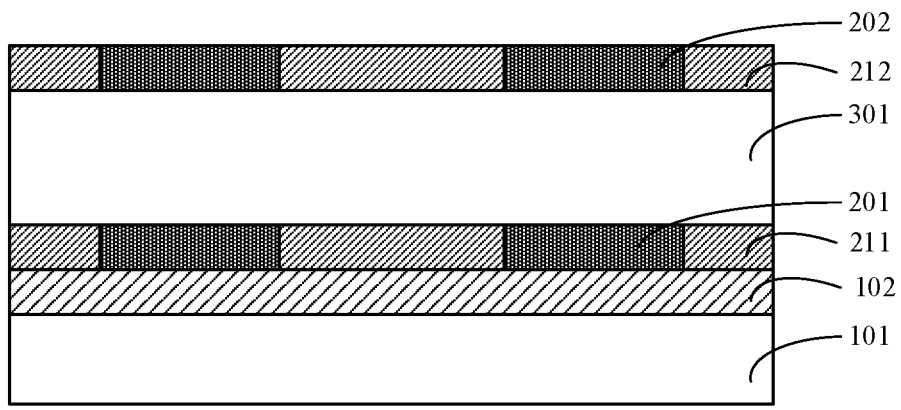

With reference to FIGS. 11 and 12, a first sacrificial layer 301 is formed on the substrate (not denoted) in the structure region, and a peripheral insulating structure 103 (refer to FIG. 13) is formed on the base (not denoted) in the wiring region, and a second wire layer 202 is formed on the first sacrificial layer 301, wherein the second wire layer 202 extends in the second direction.

It is be noted that, in this embodiment, the second barrier layer 212 is formed on the plane where the second wire layer 202 is disposed, and the second barrier layer 212 is formed of an insulating material to improve the stability of the semiconductor structure.

It is be noted that in this embodiment, the formed first wire layer 201 and the second wire layer 202 are vertically arranged, which does not constitute a limitation to this embodiment. In other embodiments, only the included angles between the first wire layer 201 and the second wire layer 202 are guaranteed, which are all within the protection scope of the present disclosure.

In this embodiment, the first sacrificial layer 301 is formed by spin coating, and the deposition rate is fast by selective coating, and a thicker first sacrificial layer 301 can be deposited in a short time. In addition, the first sacrificial layer 301 is formed of a semiconductor material containing carbon or oxygen, and the first sacrificial layer can be removed by ashing or dry etching subsequently without affecting other structures. In addition, the second wire layer 202 is formed of a semiconductor conductive material or a metal conductive material, such as doped silicon or tungsten.

Figure 13:
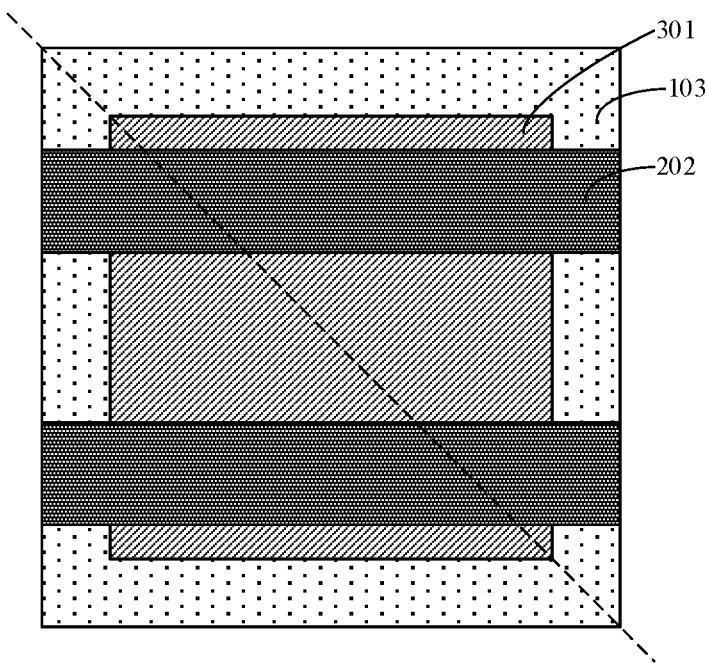
Figure 14:
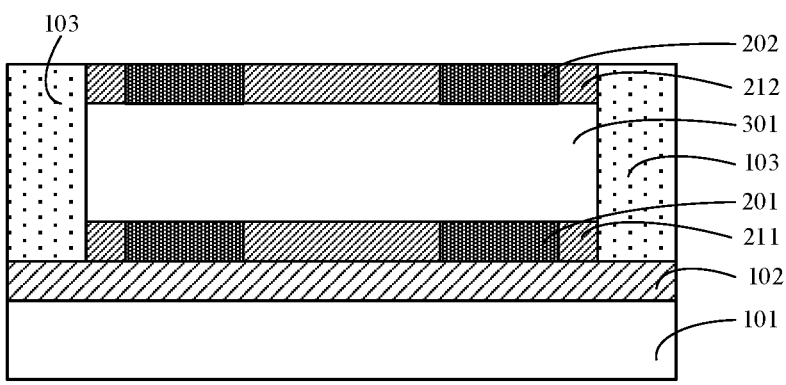

With reference to FIGS. 13 and 14, the formed second wire layer 202 extends into the peripheral insulating structure 103 of the wiring region. Specifically, the formed first wire layer 201 also extends to the peripheral insulating structure 103 of the wiring region, Preferably, the first wire layer 201 extends into the peripheral insulating structure 103 on the first side of the wiring region, and the second wire layer 202 extends into the peripheral insulating structure 103 on the second side of the wiring region, and the first side and the second side of the wiring region are disposed on different sides of the structure region. The extension directions of the first conductor layer 201 and the second conductor layer 202 are different, so that the electrical signals of the first conductor layer 201 and the second conductor layer 202 can be derived in the wiring regions on different sides of the structure region, and the horizontal area of the semiconductor structure can be further reduced.

Figure 15:
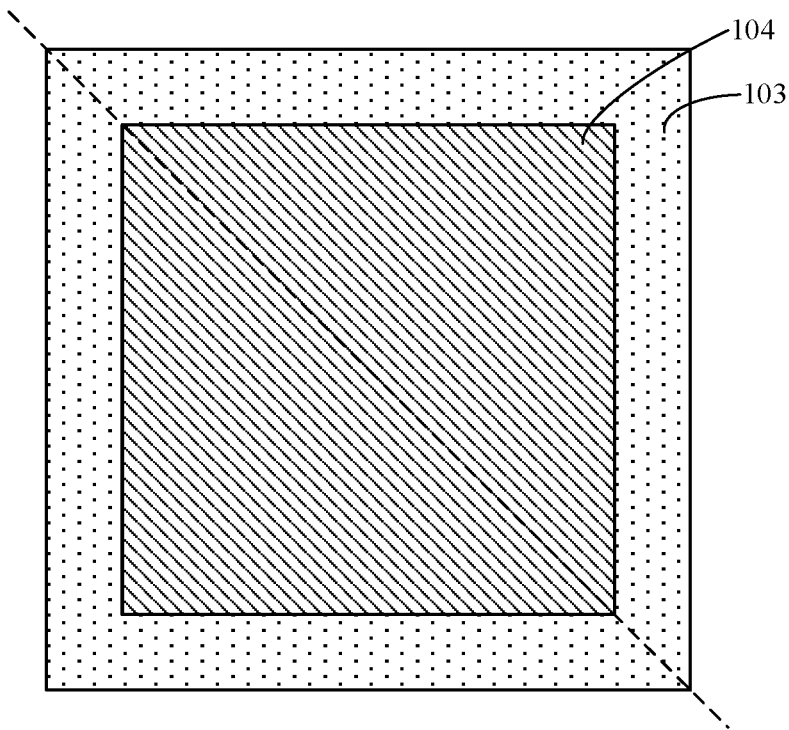
Figure 16:
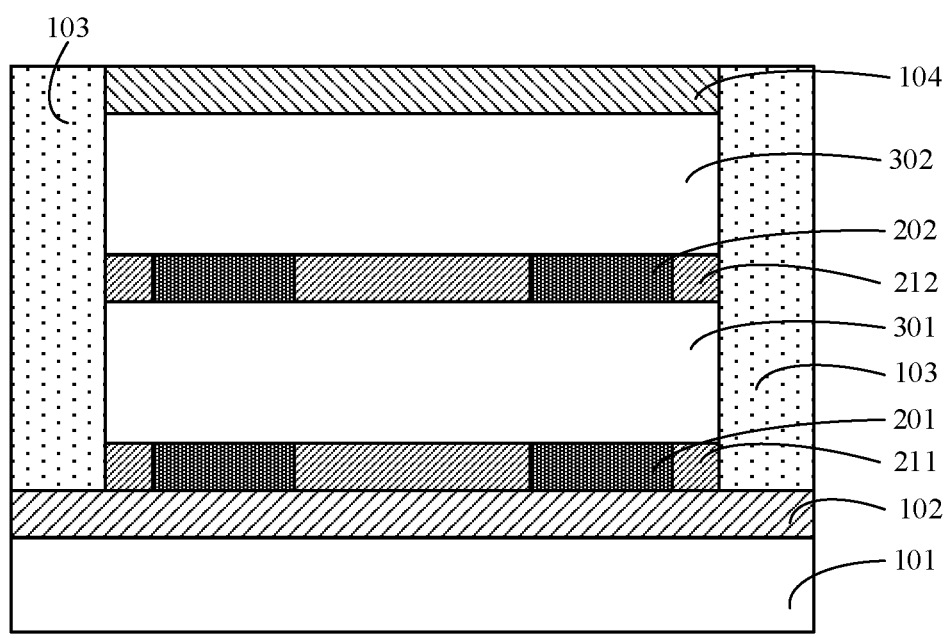

With reference to FIGS. 15 and 16, the protective layer 104 of the second sacrificial layer 302 is sequentially formed on the base (not denoted) in the structure region.

In this embodiment, the first sacrificial layer 302 is formed by spin coating, and the deposition rate is fast by selective coating, and a thicker first sacrificial layer 302 can be deposited in a short time. In addition, the first sacrificial layer 302 is formed of a semiconductor material containing carbon or oxygen, and the first sacrificial layer can be removed by ashing or dry etching subsequently without affecting other structures. In addition, the material of the protective layer 104 is silicon nitride.

Figure 17:
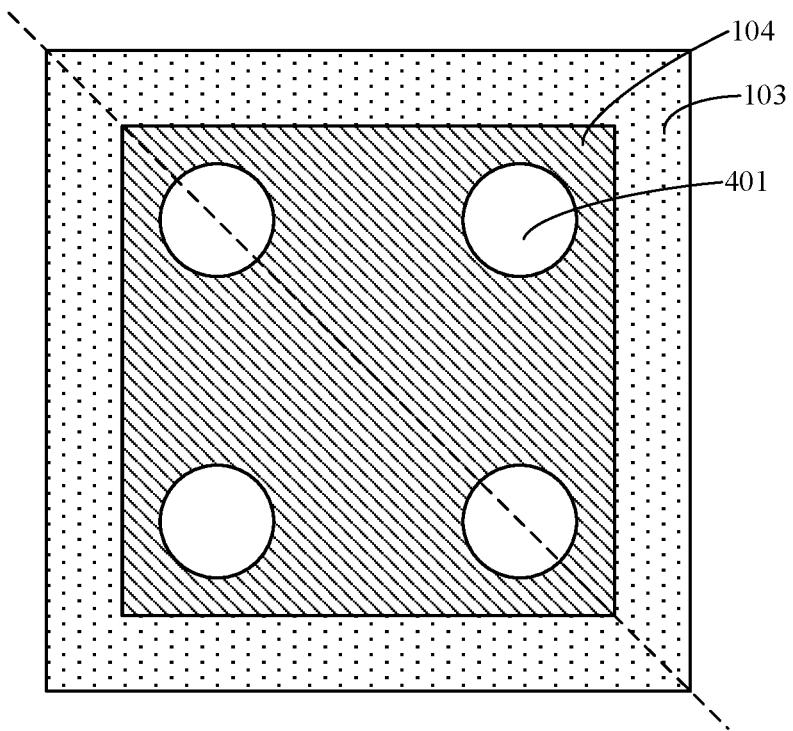
Figure 18:
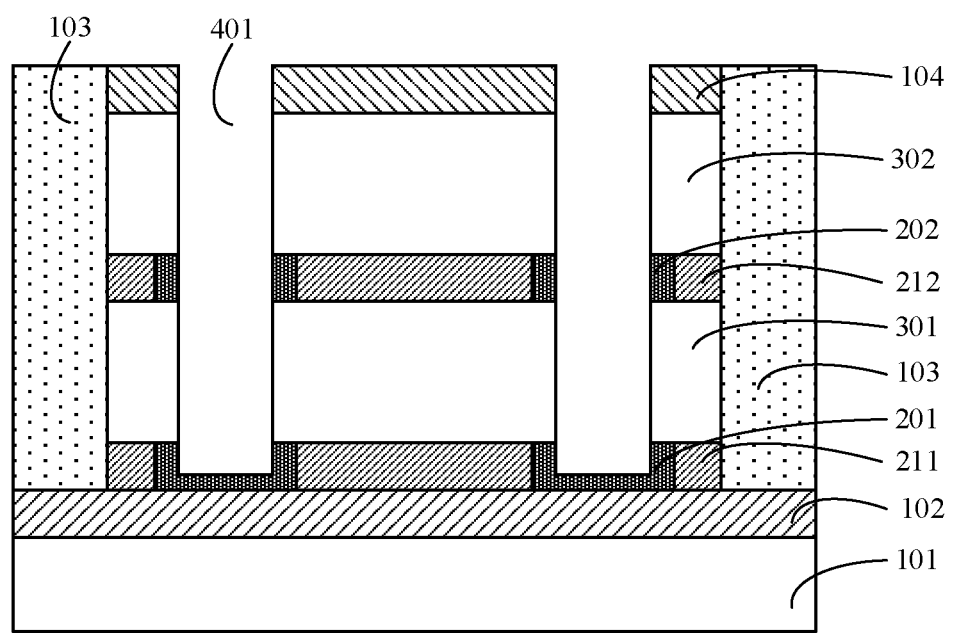

With reference to FIGS. 17 and 18, the protective layer 104 is patterned, the second sacrificial layer 302, the second wire layer 202, and the first sacrificial layer 301 form an opening 401. Furthermore, in this embodiment, a part of the first wire layer 201 is also patterned to increase the surface area of the first wire layer 201 exposed by the opening 401.

The patterning method includes but is not limited to: forming a mask layer on the protective layer 104, and then implementing the process of patterning the above semiconductor structure based on the formed mask layer. In addition, the opening 401 formed by patterning may be one or multiple, and the plurality of openings are separately provided on the base (not denoted); referring to FIG. 15, this embodiment takes the patterning to form four openings 401 as an example, which does not constitute a limitation to this embodiment. In other embodiments, the openings formed by patterning can be 1, 3, 5, etc.; in specific applications, the number of openings 401 formed by patterning can be specifically set according to requirements. In addition, in this embodiment, the four openings are disposed in a square arrangement.

Figure 19:
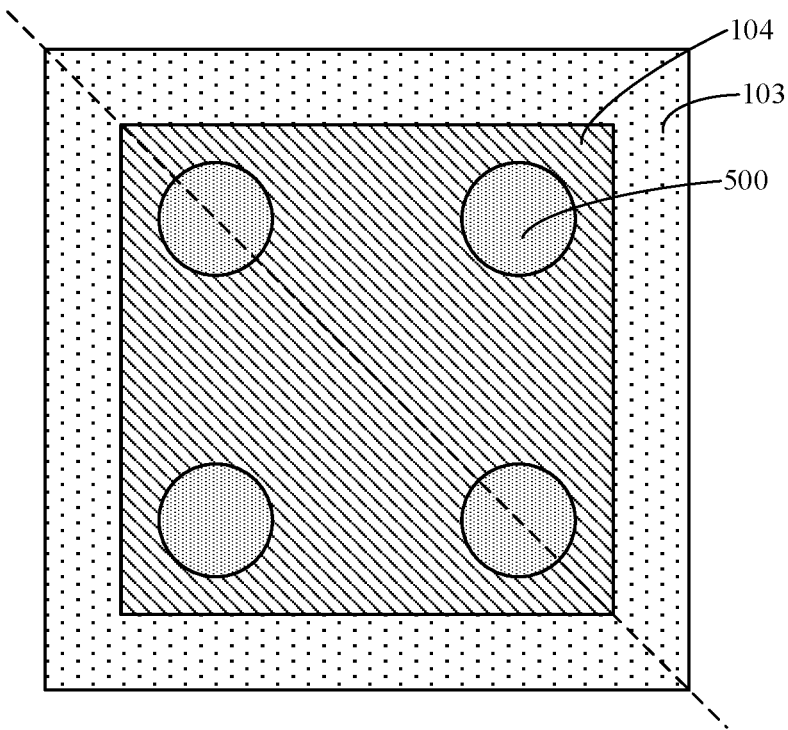
Figure 20:
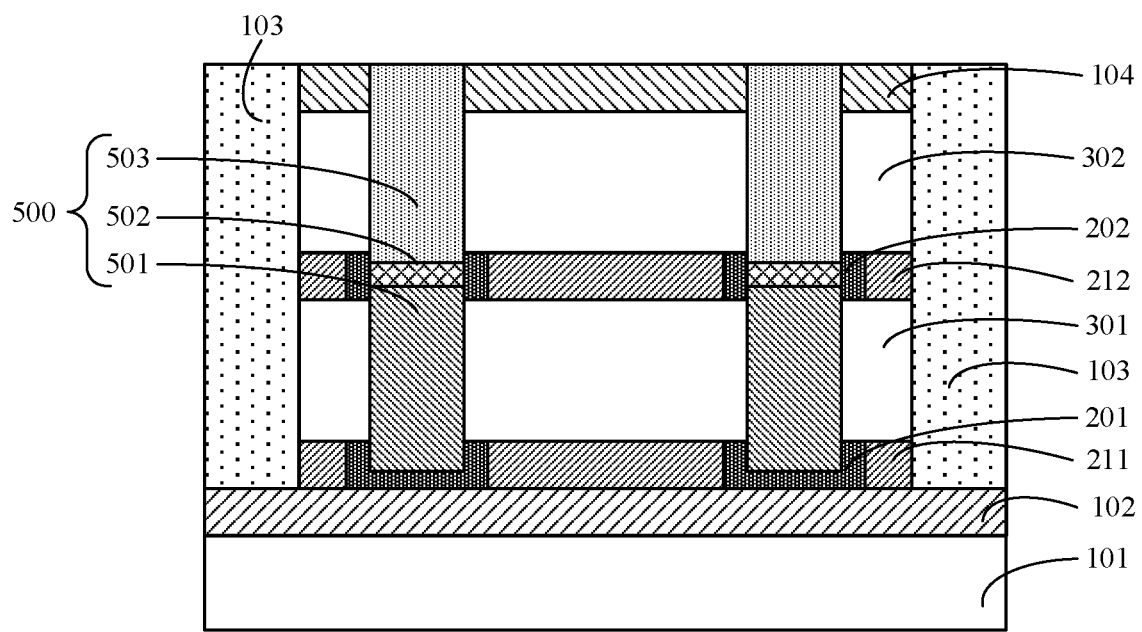

With reference to FIGS. 19 and 20, a conductive channel structure 500 filling the opening 401 is formed.

Specifically, the conductive channel structure 500 includes a first conductive channel layer 501, a conductive buffer layer 502, and a second conductive channel layer 503 stacked in sequence.

The first conductive channel layer 501 includes a first conductive channel (not denoted), and a first doped region (not denoted) and a second doped region (not denoted) on both sides of the first conductive channel (not denoted), wherein the first doped region (not denoted) is close to the second conductive channel layer 503.

Specifically, the second conductive channel layer 501 is formed by in-situ doping or deposition followed by doping. The material of the first conductive channel layer 501 is an N-type semiconductor material formed by doping single crystal silicon with a group VA element. Herein, the doping concentration at both ends of the first conductive channel layer 501 is greater than the intermediate doping concentration, thereby forming a first doped region (not denoted) and a second doped region (not denoted). In this embodiment, the second doped region (not denoted) is close to the base (not denoted), and the first doped region (not denoted) is close to the second conductive channel layer 503 as an example for detailed description, which does not constitute a limitation to this embodiment; in other embodiments, the first doped region may be close to the base, and the second doped region may be close to the first conductive channel layer.

The second conductive channel layer 503 includes a second conductive channel (not denoted), and a third doped region (not denoted) and a fourth doped region (not denoted) on both sides of the second conductive channel (not denoted), wherein the third doped region (not denoted) is close to the first conductive channel layer 501.

Specifically, the second conductive channel layer 503 is formed by in-situ doping or deposition followed by doping. The material of the second conductive channel layer 503 is an P-type semiconductor material formed by doping single crystal silicon with a group IIIA element. Herein, the doping concentration at both ends of the second conductive channel layer 503 is greater than the intermediate doping concentration, thereby forming a third doped region (not denoted) and a fourth doped region (not denoted). In this embodiment, the fourth doped region (not denoted) is close to the base (not denoted), and the third doped region (not denoted) is close to the first conductive channel layer 501 as an example for detailed description, which does not constitute a limitation to this embodiment; in other embodiments, the third doped region may be away from the base, and the fourth doped region may be close to the first conductive channel layer.

It is be noted that one of the first conductive channel layer 501 and the second conductive channel layer 503 is an N-type conductive channel, and the other is a P-type conductive channel. In this embodiment, the first conductive channel layer 501 is an N-type conductive channel, and the second conductive channel layer 503 is a P-type conductive channel as an example for detailed description, which does not constitute a limitation of this embodiment; in other embodiments, the first conductive channel layer is a P-type conductive channel, and the second conductive channel layer is an N-type conductive channel as an example for detailed description.

The conductive buffer layer 502 is disposed between the first conductive channel layer 501 and the second conductive channel layer 503 for reducing electrical interference between the first doped region (not denoted) and the third doped region (not denoted). In an example, the material of the conductive buffer layer 502 is polysilicon, and the conductive buffer layer 502 reduces the dielectric constant between the first doped region (not denoted) and the third doped region (not denoted), thereby preventing the problem of electrical interference between the doped region (not denoted) and the third doped region (not denoted).

Figure 21:
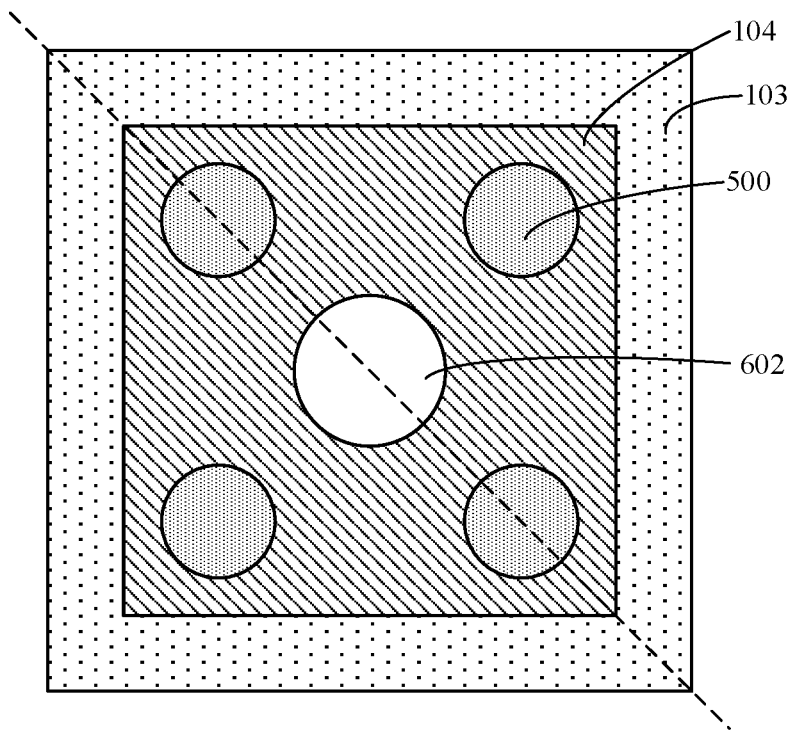
Figure 22:
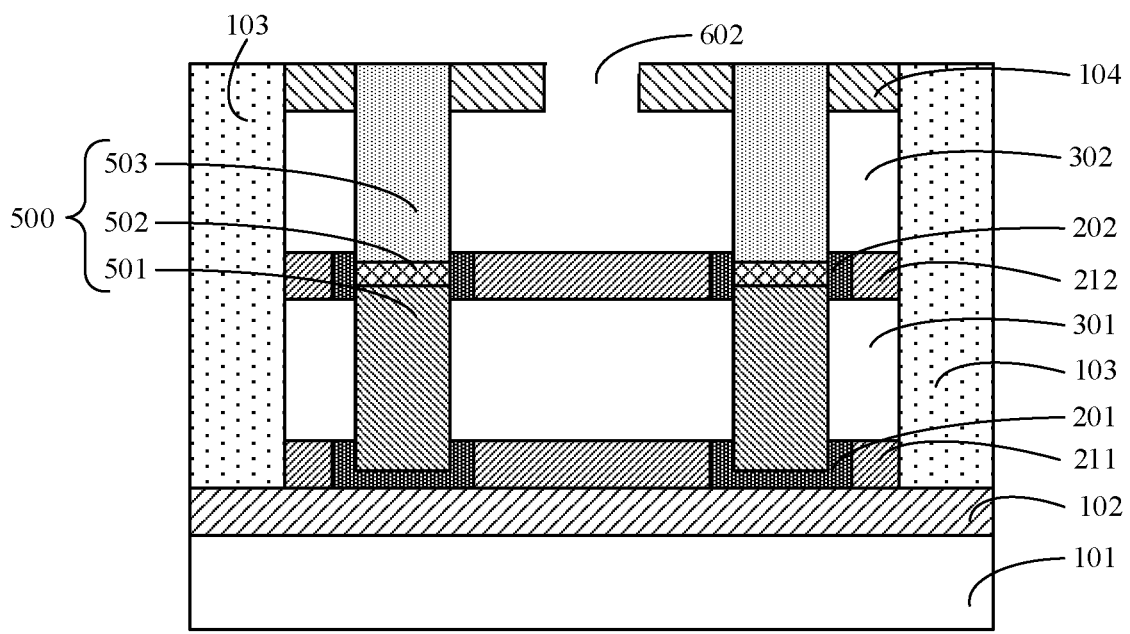
FIG. 22, FIG. 23, and FIG. 28 respectively illustrate schematic diagrams of cross-sectional structures corresponding to the respective steps in a method for forming a semiconductor structure provided by another embodiment of the present disclosure.
Figure 23:
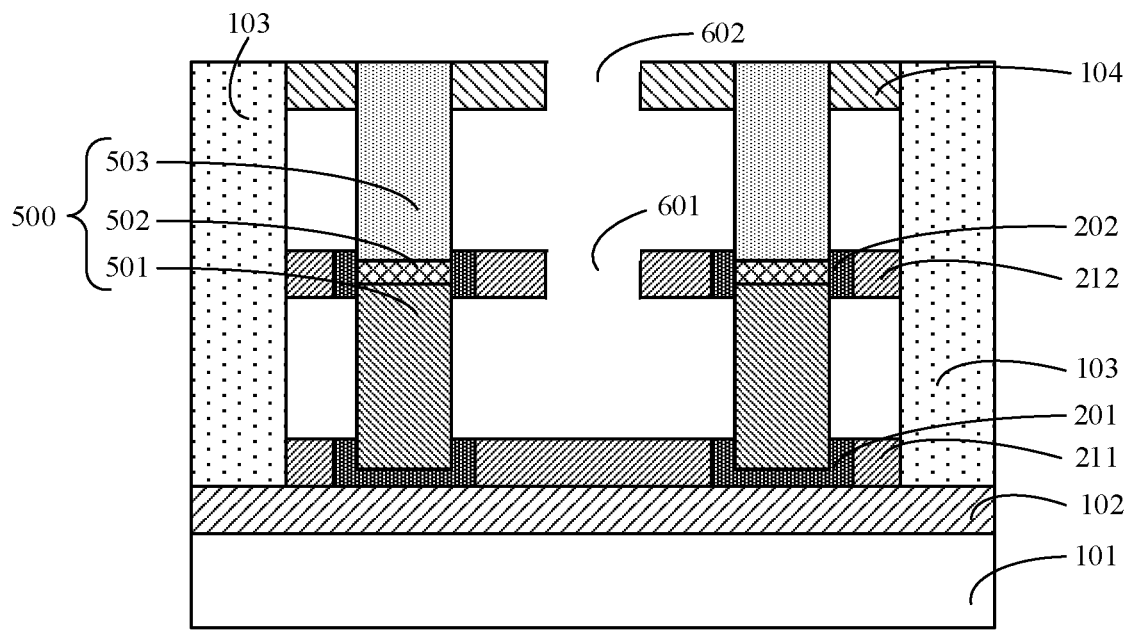

With reference to FIGS. 21-23, a part of the protective layer 104 is patterned until the second sacrificial layer 302 is not exposed to form a via 602, and the second sacrificial layer is removed based on the via 602; a part of the second barrier layer 212 is patterned until the first sacrificial layer 301 is exposed to form a sub-via 601, and the first sacrificial layer 301 is removed based on the sub-via 601.

The patterning method includes, but is not limited to, forming a mask layer on the protective layer 104, and then implementing the process of patterning the above semiconductor structure based on the formed mask layer.

In this embodiment, the first sacrificial layer 301 and the second sacrificial layer 302 are removed by wet etching. Those skilled in the art know that the wet etching is used to etch a certain semiconductor material, which does not affect other semiconductor structures; in addition, in other embodiments, the first sacrificial layer and the second sacrificial layer may be removed by ashing, and the removal rate of the first sacrificial layer and the second sacrificial layer by using the ashing process is relatively fast without affecting other semiconductor structures at the same time.

Figure 24:
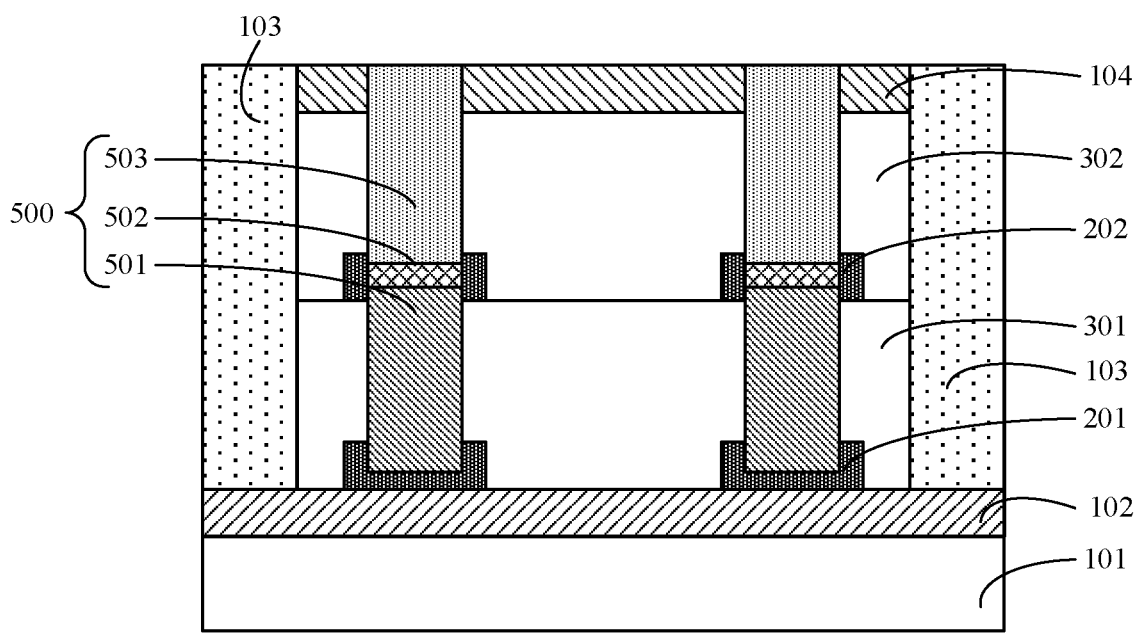
Figure 25:
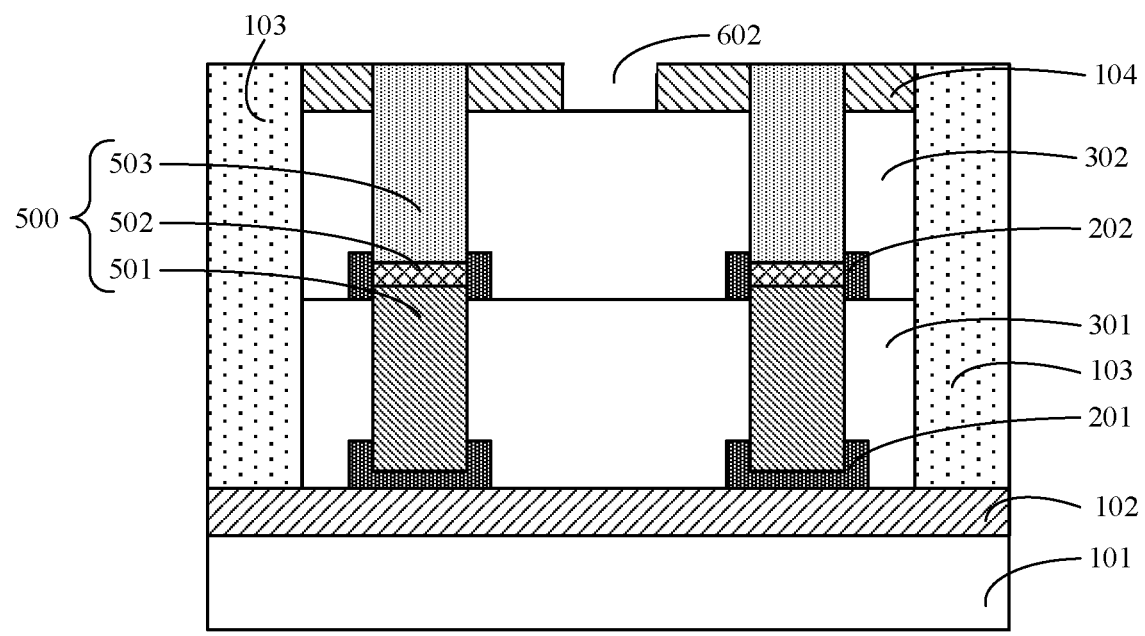
Figure 26:
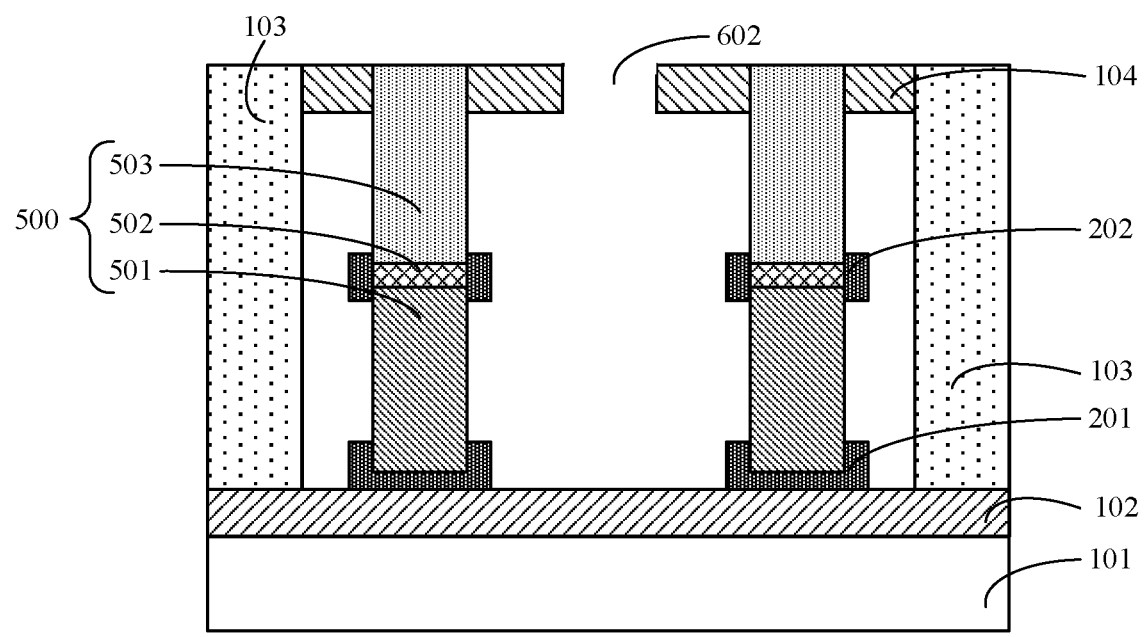

In other embodiments, if there is no first barrier layer 211 filling the plane where the first wire layer 201 is disposed, there is no second barrier layer 212 filling the plane where the second wire layer 202 is disposed, referring to FIGS. 24-26, a part of the protective layer 104 is patterned until the second sacrificial layer 302 is exposed, and the second sacrificial layer 302 and the first sacrificial layer 301 are removed.

Figure 27:
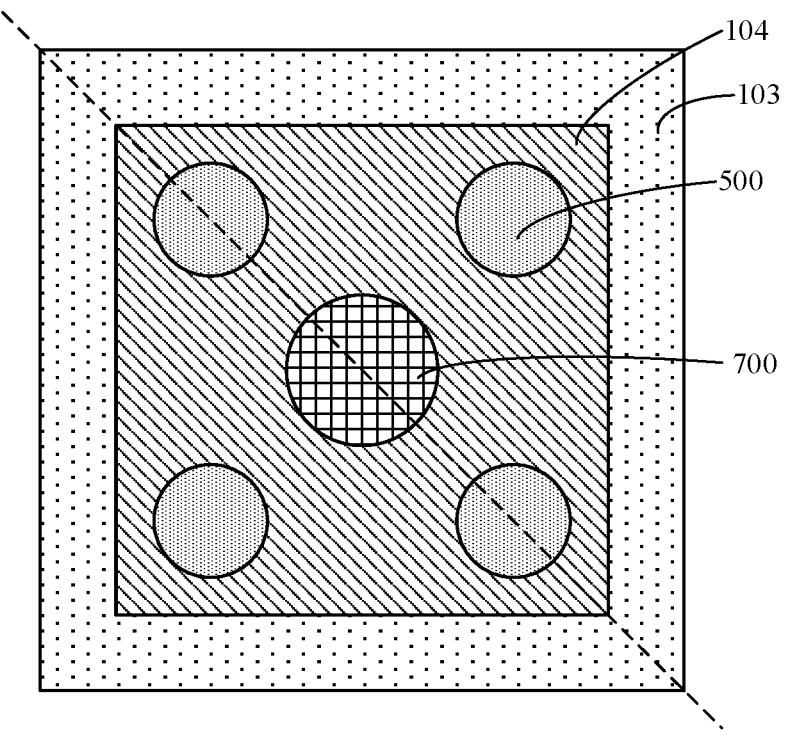
Figure 28:
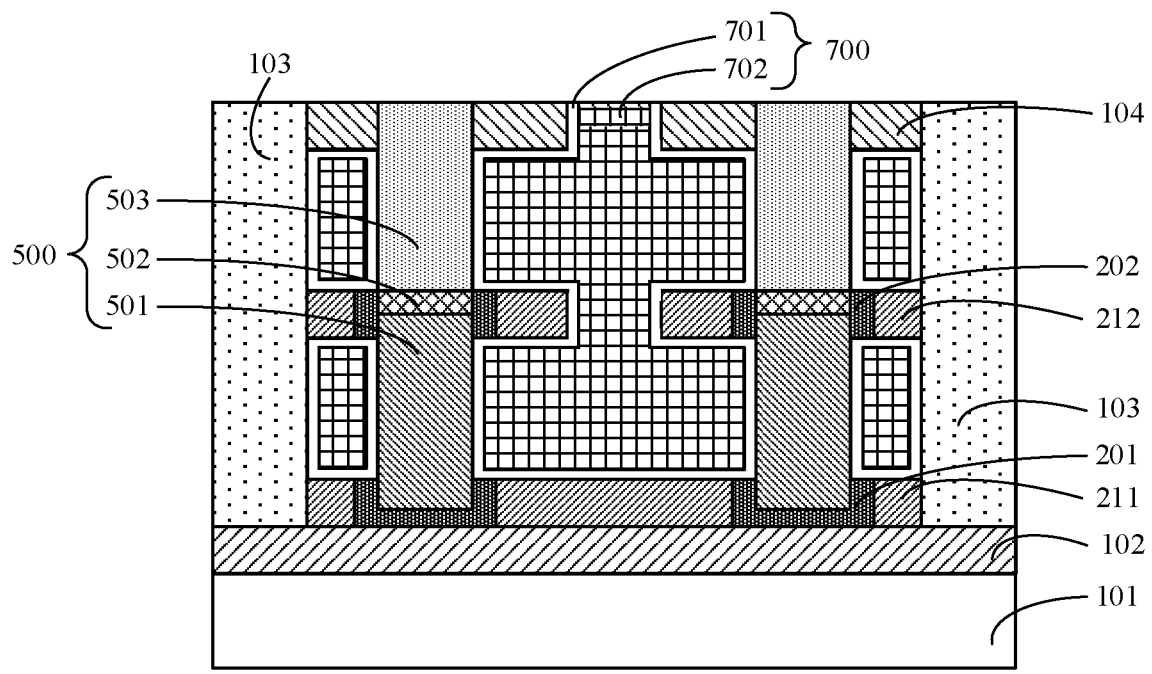

With reference to FIGS. 27 and 28, a gate structure 700 which fills the gap is formed.

Specifically, the gate structure 700 includes a gate oxide layer 702 and a metal gate layer 701. The gate oxide layer covers the first conductive channel, the second conductive channel, and the first wire layer 201 (refer to FIGS. 2 to 4) rr the isolation layer 102 (refer to FIG. 5 to FIG. 7) and the surface exposed by the second wire layer 202; the metal gate layer 701 is configured to fill the gap between the gate oxide layers 702, thereby forming the gate structure 700.

In an example, in order to prevent electrical crosstalk between the first wire layer 201 as well as the second wire layer 202 and the gate structure 700, forming the above semiconductor structure further includes: Forming a first insulating layer (not illustrated) between the first wire layer 201 and the gate structure 700; and forming a second insulating layer (not illustrated) between the second wire layer 202 and the gate structure 700.

With reference to FIGS. 1 to 7 (refer to FIGS. 5 to 7 with the base as the first wire layer), the first conductive plug 801 electrically connected to the first wire layer 201 is formed, and the second conductive plug 802 electrically connected to the second wire layer 202 is formed, the third conductive plug 803 electrically connected to the fourth doped region (not identified) is formed, and the fourth conductive plug 804 electrically connected to the gate structure 700 is formed, which specifically is:

If the first wire layer 201 and the substrate 101 are disposed separately, referring to FIG. 2 and FIG. 3, the first conductive plug 801 penetrates the peripheral insulating structure 103 and is electrically connected to the first wire layer 201. Further, the first conductive plug 801 also penetrates a part of the first wire layer 201 to increase the contact area between the first conductive plug 801 and the first wire layer 201, thereby reducing the contact resistance between the first conductive plug 801 and the first wire layer 201.

If the first wire layer is disposed in the substrate 101, referring to FIGS. 4 and 5, the first conductive plug 801 penetrates the peripheral insulating structure 103 and the isolation layer 102, and is electrically connected to the first wire layer in the substrate 101. Furthermore, the first conductive plug 801 also penetrates a part of the substrate 101 and the first wire layer to increase the contact area between the first conductive plug 801 and the first wire layer, thereby reducing the contact resistance between the first conductive plug 801 and the first wire layer.

The second conductive plug 802 penetrates a part of the peripheral insulating structure 103 and is in contact with the second wire 202. Furthermore, the second conductive plug 802 also penetrates a part of the second wire 202 to increase the contact area between the second conductive plug 802 and the second wire 202, thereby reducing the contact resistance between the second conductive plug 802 and the second wire 202.

The third conductive plug 803 is in contact with the fourth doped region (not denoted). Furthermore, the third conductive plug 803 also penetrates a part of the fourth doped region (not denoted) to increase the contact area between the third conductive plug 803 and the fourth doped region (not denoted), thereby reducing the contact resistance between the third conductive plug 803 and the fourth doped region (not denoted).

The fourth conductive plug 804 is in contact with the top of the gate structure 700. Furthermore, the fourth conductive plug 804 also penetrates a part of the gate structure 700 to increase the contact area between the fourth conductive plug 804 and the gate structure 700, thereby reducing the contact resistance between the fourth conductive plug 804 and the gate structure 700.

Compared with the related art, by forming first conductive channel layer and the second conductive channel layer that are the vertically arranged, that is, by forming two conductive channels that are vertically arranged, the conductive channels are disposed vertically, and the gate structure surrounds the first conductive channel and the second conductive channel in the horizontal direction, so as to prevent the conductive channel from occupying a large area in the horizontal direction.

The above steps are divided only for the sake of clear description. During implementation, they can be combined into one step or some steps can be divided into a plurality of steps. As long as they include the same logical relationship, they are within the protection scope of this patent; Adding unimportant modifications to the process or introducing unimportant designs without changing the core design of the process are within the protection scope of this patent.

Since the above embodiments and this embodiment correspond to each other, this embodiment can be implemented in cooperation with the above embodiments. The relevant technical details mentioned in the above embodiments are still valid in this embodiment, and the technical effects that can be achieved in the above embodiments can also be achieved in this embodiment. In order to reduce repetition, details are not repeated here. Correspondingly, the related technical details mentioned in this embodiment can also be applied to the above embodiments.

Another embodiment of the present disclosure relates to a method for forming a semiconductor structure, which includes: providing a base including a structure region and a wiring region, wherein the base includes a substrate, a first wire layer which extends in a first direction and an isolation layer; forming a first sacrificial layer on the base in the structure region, and forming a peripheral insulating structure on the base in the wiring region; patterning the first sacrificial layer to form a first channel penetrating through the first sacrificial layer; forming a second wire layer which fills the first channel and is partially disposed on the first sacrificial layer, extends into the peripheral insulating structure of the wiring region, and extends in the second direction; sequentially forming a second sacrificial layer and a protective layer on the base in the structure region; patterning the second sacrificial layer to form a second channel penetrating through the second sacrificial layer, and the projections of the first channel and the second channel on the base overlap with each other; forming a second conductive channel layer filling the second channel; patterning a part of the protective layer to expose the second sacrificial layer, and removing the second sacrificial layer and the first sacrificial layer; and forming a gate structure which fills the gap. Compared with the previous embodiment, in this embodiment, the conductive channel structure is formed in different steps. Compared with the conductive channel structure formed at one time, the depth and width of the groove to be filled is relatively small, so as to ensure that the formed conductive channel structure has good compactness.

FIGS. 29-34 illustrate schematic diagrams of the cross-sectional structures corresponding to the respective steps in the method for forming a semiconductor structure provided by another embodiment of the present disclosure. The method for forming the semiconductor structure provided in this embodiment will be described in detail below in combination with the accompanying drawings, and the parts that are the same as or corresponding to the above embodiments will not be described in detail below.

Figure 29:
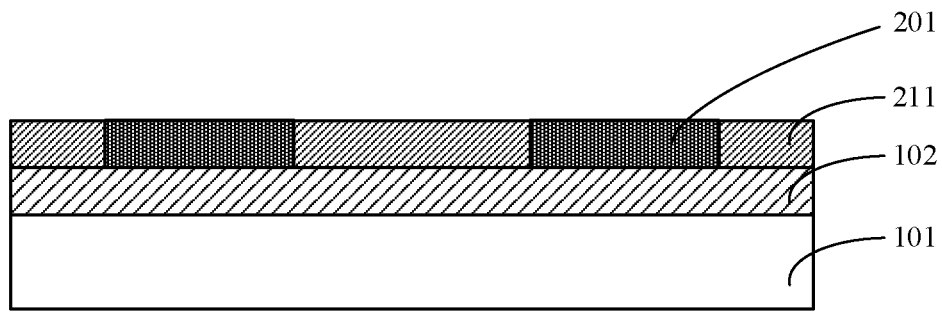
FIG. 29, FIG. 30, FIG. 31, FIG. 32, FIG. 33, and FIG. 34 respectively illustrate schematic diagrams of cross-sectional structures corresponding to the respective steps in the method for forming a semiconductor structure provided by another embodiment of the present disclosure.

With reference to FIGS. 8 and 29, a base (not denoted) including a structure region and a wiring region is provided, wherein the base (not denoted) includes a substrate 101, a first wire layer 201 and an isolation layer 102.

Figure 30:
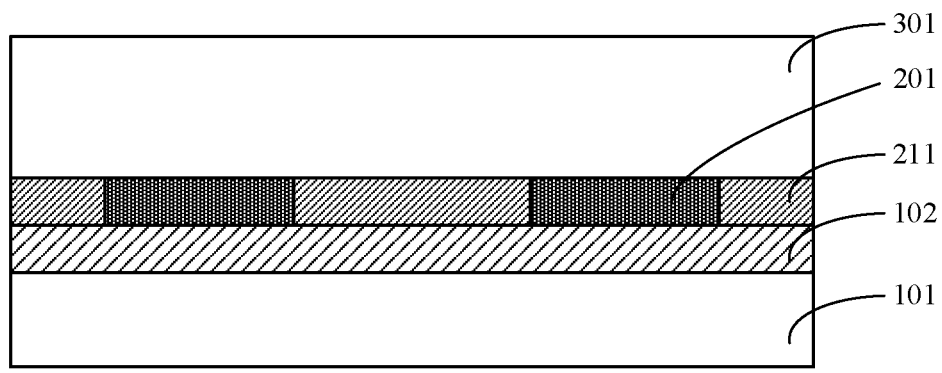

With reference to FIG. 30, a first sacrificial layer 301 is formed on the base (not denoted) in the structure region.

Figure 31:
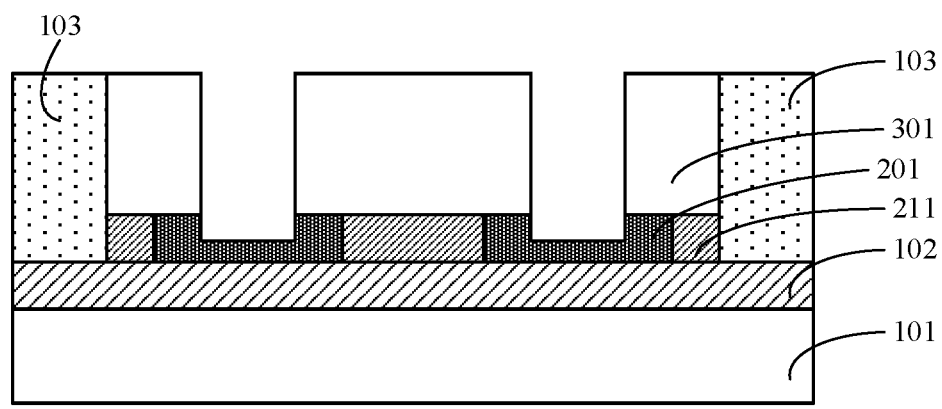

With reference to FIG. 31, a peripheral insulating structure 103 is formed on the base (not denoted) in the wiring region, the first sacrificial layer 301 is patterned to form a first channel 402 penetrating through the first sacrificial layer.

Herein, the patterning method includes but is not limited to: forming a mask layer on the first sacrificial layer 301, and then implementing the process of patterning the above semiconductor structure based on the formed mask layer. In addition, the first channel 402 formed by patterning may be one or multiple, and the plurality of openings are separately provided on the base (not denoted); referring to FIG. 31, this embodiment takes the patterning to form four first openings 402 as an example, which does not constitute a limitation to this embodiment. In other embodiments, the openings formed by patterning can be 1, 3, 5, etc.; in specific applications, the number of first openings 402 formed by patterning can be specifically set according to requirements. In addition, in this embodiment, the four openings are disposed in a square arrangement.

Figure 32:
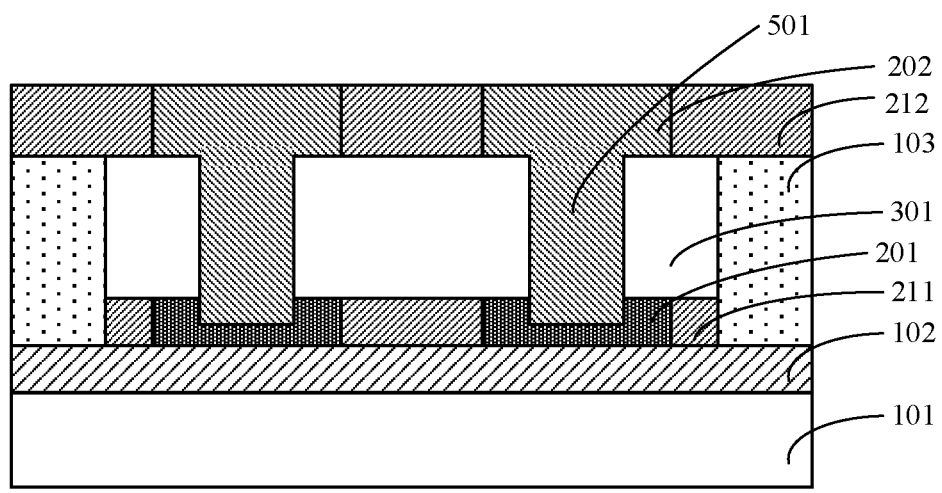

With reference to FIG. 32, a second wire layer 202 is formed to fill the first channel 402 and cover the first sacrificial layer 301. The second wire layer 202 extends into the peripheral insulating structure 103 in the wiring region, wherein the second wire layer 202 filling the first channel 402 is made as the first conductive channel layer 501.

The first conductive channel layer 501 includes a first conductive channel (not denoted), and a first doped region (not denoted) and a second doped region (not denoted) on both sides of the first conductive channel (not denoted), wherein the first doped region (not denoted) is close to the second conductive channel layer 503.

Specifically, the second conductive channel layer 501 is formed by in-situ doping or deposition followed by doping. The material of the first conductive channel layer 501 is an N-type semiconductor material formed by doping single crystal silicon with a group VA element. Herein, the doping concentration at both ends of the first conductive channel layer 501 is greater than the intermediate doping concentration, thereby forming a first doped region (not denoted) and a second doped region (not denoted). In this embodiment, the second doped region (not denoted) is close to the base (not denoted), and the first doped region (not denoted) is close to the second conductive channel layer 503 as an example for detailed description, which does not constitute a limitation to this embodiment; in other embodiments, the first doped region may be close to the base, and the second doped region may be close to the first conductive channel layer.

Figure 33:
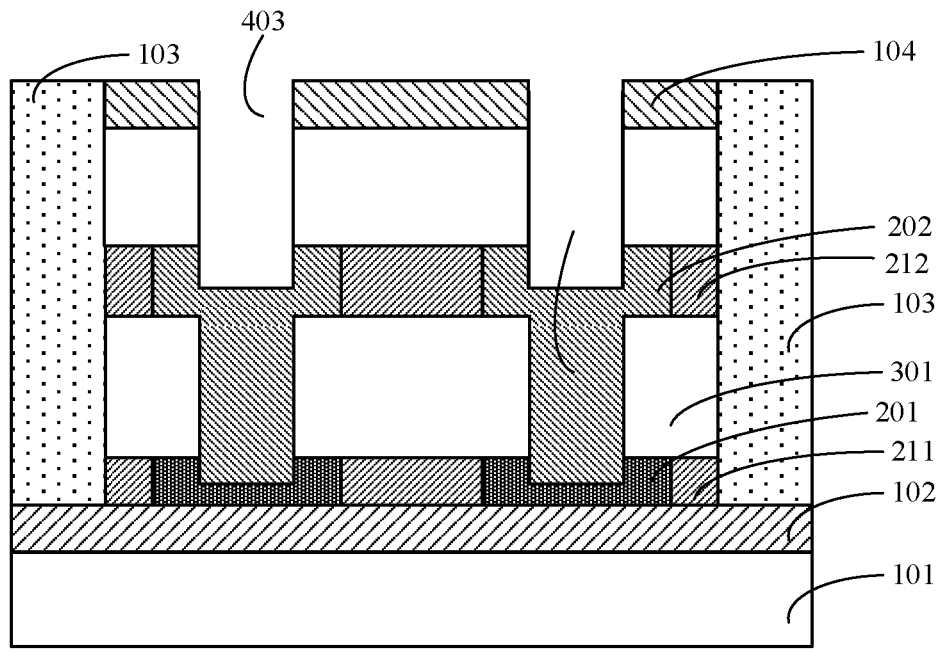

With reference to FIG. 33, the second sacrificial layer 302 and the protective layer 104 are sequentially formed on the base (not identified) in the structure region; the second sacrificial layer 302 is patterned to form a second channel 403 penetrating the second sacrificial layer 302, the projections of the first channel 402 and the second channel 403 on the base overlapped with each other.

Herein, the patterning method includes but is not limited to: forming a mask layer on the second sacrificial layer 302, and then implementing the process of patterning the above semiconductor structure based on the formed mask layer. In addition, the first channel 402 formed by patterning may be one or multiple, and the plurality of openings are separately provided on the base (not denoted); referring to FIG. 33, this embodiment takes the patterning to form four second openings 403 as an example, which does not constitute a limitation to this embodiment. In other embodiments, the openings formed by patterning can be 1, 3, 5, etc.; in specific applications, the number of the first openings 402 formed by patterning can be specifically set according to requirements. In addition, in this embodiment, the projections of the first channel 402 and the second channel 403 on the base overlap with each other; in other embodiments, the first channel and the second channel can be set arbitrarily.

Figure 34:
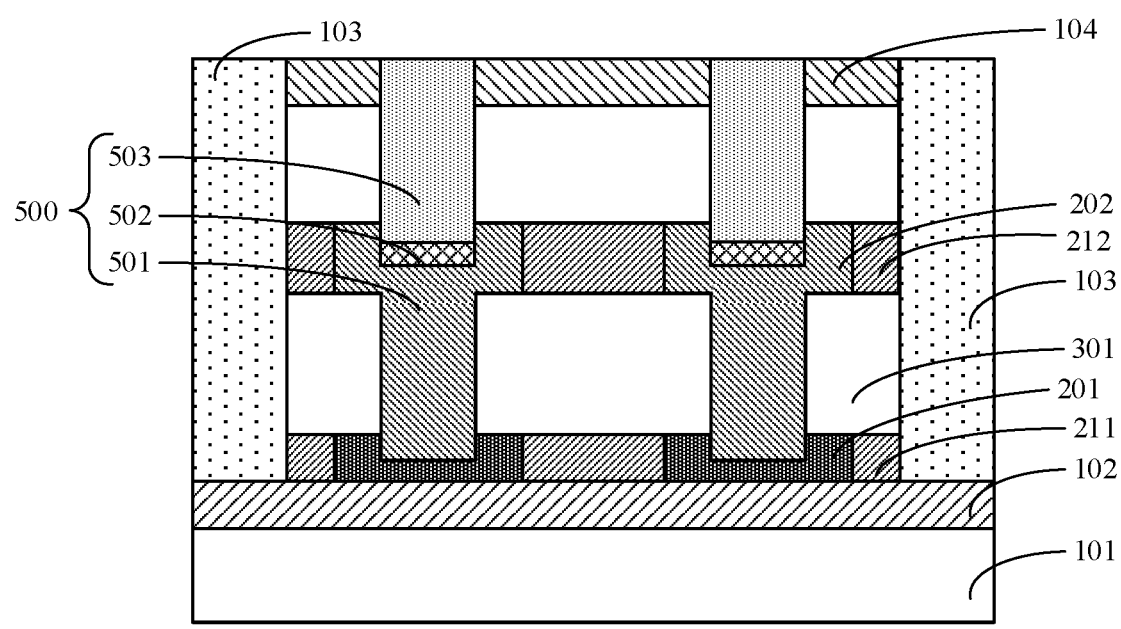

With reference to FIG. 34, a conductive buffer layer 502 and a second conductive channel layer 503 that fill the second channel are formed.

The second conductive channel layer 503 includes a second conductive channel (not denoted), and a third doped region (not denoted) and a fourth doped region (not denoted) on both sides of the second conductive channel (not denoted), wherein the third doped region (not denoted) is close to the first conductive channel layer 501.

Specifically, the second conductive channel layer 503 is formed by in-situ doping or deposition followed by doping. The material of the first conductive channel layer 503 is an P-type semiconductor material formed by doping single crystal silicon with a group IIIA element. Herein, the doping concentration at both ends of the second conductive channel layer 503 is greater than the intermediate doping concentration, thereby forming a third doped region (not denoted) and a fourth doped region (not denoted). In this embodiment, the fourth doped region (not denoted) is away form the base (not denoted), and the third doped region (not denoted) is close to the first conductive channel layer 501 as an example for detailed description, which does not constitute a limitation to this embodiment; in other embodiments, the third doped region may be away from the base, and the fourth doped region may be close to the first conductive channel layer.

It is be noted that one of the first conductive channel layer 501 and the second conductive channel layer 503 is an N-type conductive channel, and the other is a P-type conductive channel. In this embodiment, the first conductive channel layer 501 is an N-type conductive channel, and the second conductive channel layer 503 is a P-type conductive channel as an example for detailed description, which does not constitute a limitation of this embodiment; in other embodiments, the first conductive channel layer is a P-type conductive channel, and the second conductive channel layer is an N-type conductive channel as an example for detailed description.

The conductive buffer layer 502 is disposed between the first conductive channel layer 501 and the second conductive channel layer 503 for reducing electrical interference between the first doped region (not denoted) and the third doped region (not denoted). In an example, the material of the conductive buffer layer 502 is polysilicon, and the conductive buffer layer 502 reduces the dielectric constant between the first doped region (not denoted) and the third doped region (not denoted), thereby preventing the problem of electrical interference between the doped region (not denoted) and the third doped region (not denoted).

With reference to FIGS. 21-23, a part of the protective layer 104 is patterned until the second sacrificial layer 302 is not exposed to form a via 602, and the second sacrificial layer is removed based on the via 602; a part of the second barrier layer 212 is patterned until the first sacrificial layer 301 is exposed to form a sub-via 601, and the first sacrificial layer 301 is removed based on the sub-via 601.

The patterning method includes but is not limited to: forming a mask layer on the protective layer 104, and then implementing the process of patterning the above semiconductor structure based on the formed mask layer.

In this embodiment, the first sacrificial layer 301 and the second sacrificial layer 302 are removed by wet etching. Those skilled in the art know that the wet etching is used to etch a certain semiconductor material, which does not affect other semiconductor structures; in addition, in other embodiments, the first sacrificial layer and the second sacrificial layer may be removed by ashing, and the removal rate of the first sacrificial layer and the second sacrificial layer by using the ashing process is relatively fast without affecting other semiconductor structures at the same time.

In other embodiments, if there is no first barrier layer 211 filling the plane where the first wire layer 201 is disposed, there is no second barrier layer 212 filling the plane where the second wire layer 202 is disposed, referring to FIGS. 24-26, a part of the protective layer 104 is patterned until the second sacrificial layer 302 is exposed, and the second sacrificial layer 302 and the first sacrificial layer 301 are removed.

With reference to FIGS. 27 and 28, a gate structure 700 which fills the gap is formed.

Specifically, the gate structure 700 includes a gate oxide layer 702 and a metal gate layer 701. The gate oxide layer covers the first conductive channel, the second conductive channel, and the first wire layer 201 (refer to FIGS. 2 to 4) rr the isolation layer 102 (refer to FIG. 5 to FIG. 7) and the surface exposed by the second wire layer 202; the metal gate layer 701 is configured to fill the gap between the gate oxide layers 702, thereby forming the gate structure 700.

In an example, in order to prevent electrical crosstalk between the first wire layer 201 as well as the second wire layer 202 and the gate structure 700, forming the above semiconductor structure further includes: Forming a first insulating layer (not illustrated) between the first wire layer 201 and the gate structure 700; and forming a second insulating layer (not illustrated) between the second wire layer 202 and the gate structure 700.

With reference to FIGS. 1 to 7 (refer to FIGS. 5 to 7 with the base as the first wire layer), the first conductive plug 801 electrically connected to the first wire layer 201 is formed, and the second conductive plug 802 electrically connected to the second wire layer 202 is formed, the third conductive plug 803 electrically connected to the fourth doped region (not identified) is formed, and the fourth conductive plug 804 electrically connected to the gate structure 700 is formed, which specifically is:

If the first wire layer 201 and the substrate 101 are disposed separately, referring to FIG. 2 and FIG. 3, the first conductive plug 801 penetrates the peripheral insulating structure 103 and is electrically connected to the first wire layer 201. Further, the first conductive plug 801 also penetrates a part of the first wire layer 201 to increase the contact area between the first conductive plug 801 and the first wire layer 201, thereby reducing the contact resistance between the first conductive plug 801 and the first wire layer 201.

If the first wire layer is disposed in the substrate 101, referring to FIGS. 4 and 5, the first conductive plug 801 penetrates the peripheral insulating structure 103 and the isolation layer 102, and is electrically connected to the first wire layer in the substrate 101. Furthermore, the first conductive plug 801 also penetrates a part of the substrate 101 and the first wire layer to increase the contact area between the first conductive plug 801 and the first wire layer, thereby reducing the contact resistance between the first conductive plug 801 and the first wire layer.

The second conductive plug 802 penetrates a part of the peripheral insulating structure 103 and is in contact with the second wire 202. Furthermore, the second conductive plug 802 also penetrates a part of the second wire 202 to increase the contact area between the second conductive plug 802 and the second wire 202, thereby reducing the contact resistance between the second conductive plug 802 and the second wire 202.

The third conductive plug 803 is in contact with the fourth doped region (not denoted). Furthermore, the third conductive plug 803 also penetrates a part of the fourth doped region (not denoted) to increase the contact area between the third conductive plug 803 and the fourth doped region (not denoted), thereby reducing the contact resistance between the third conductive plug 803 and the fourth doped region (not denoted).

The fourth conductive plug 804 is in contact with the top of the gate structure 700. Furthermore, the fourth conductive plug 804 also penetrates a part of the gate structure 700 to increase the contact area between the fourth conductive plug 804 and the gate structure 700, thereby reducing the contact resistance between the fourth conductive plug 804 and the gate structure 700.

Compared with the related art, by forming first conductive channel layer and the second conductive channel layer that are the vertically arranged, that is, by forming two conductive channels that are vertically arranged, the conductive channels are disposed vertically, and the gate structure surrounds the first conductive channel and the second conductive channel in the horizontal direction, so as to prevent the conductive channel from occupying a large area in the horizontal direction.

The above steps are divided only for the sake of clear description. During implementation, they can be combined into one step or some steps can be divided into a plurality of steps. As long as they include the same logical relationship, they are within the protection scope of this patent; Adding unimportant modifications to the process or introducing unimportant designs without changing the core design of the process are within the protection scope of this patent.

Since the above embodiments and this embodiment correspond to each other, this embodiment can be implemented in cooperation with the above embodiments. The relevant technical details mentioned in the above embodiments are still valid in this embodiment, and the technical effects that can be achieved in the above embodiments can also be achieved in this embodiment. In order to reduce repetition, details are not repeated here. Correspondingly, the related technical details mentioned in this embodiment can also be applied to the above embodiments.

Those skilled in the art can understand that the above embodiments are specific embodiments for realizing the present application, and in practical applications, various changes can be made to them in form and details without departing from the spirit and scope of the present disclosure.

What is claimed is:

1. A semiconductor structure comprising:
a base and a conductive channel structure on the base, the conductive channel structure comprising a first conductive channel layer, a conductive buffer layer, and a second conductive channel layer stacked in sequence, wherein the first conductive channel layer comprises a first conductive channel, a first doped region and a second doped region on both sides of the first conductive channel, wherein the first doped region is close to the second conductive channel layer;
the second conductive channel layer comprises a second conductive channel, and a third doped region and a fourth doped region on both sides of the second conductive channel, wherein the third doped region is close to the first conductive channel layer; and
the conductive buffer layer is configured to reduce electrical interference between the first doped region and the third doped region;
a first wire layer, disposed on the base, extending in a first direction, and in contact with the second doped region in the first direction;
a second wire layer, extending in a second direction, and in contact with the first doped region and the third doped region in the second direction;
a gate structure, disposed around the first conductive channel and the second conductive channel; and
a protective layer, nested on top of all of separate conductive channel structures, in contact with the fourth doped region, and having a via penetrating the protective layer in a direction perpendicular to a surface of the base, the via being filled with the gate structure.

2. The semiconductor structure of claim 1, wherein the conductive channel structures are separately provided on the base;
the first wire layer is in contact with the second doped regions in all of the conductive channel structures disposed in the first direction;
the second wire layer is in contact with the first doped regions and the third doped regions in all of the conductive channel structures disposed in the second direction; and
the gate structure also fills a gap between a plane where the first wire layer is disposed and a plane where the second wire layer is disposed.

3. The semiconductor structure of claim 1, wherein the base comprises a structure region and a wiring region which is disposed at periphery of the structure region;
a peripheral insulating structure is disposed in the wiring region of the base, the first wire layer and the second wire layer extend into the peripheral insulating structure of the wiring region,
the semiconductor structure further comprises: a first conductive plug and a second conductive plug;
wherein the first conductive plug penetrates the peripheral insulating structure and is in contact with the first wire layer; and
the second conductive plug penetrates a part of an outer peripheral insulating structure and is in contact with the second wire layer.

4. The semiconductor structure of claim 3, wherein an angle between the first direction and the second direction is greater than 0 degree.

5. The semiconductor structure of claim 3, further comprising:
a third conductive plug, in contact with the fourth doped region; and
a fourth conductive plug, in contact with top of the gate structure.

6. The semiconductor structure of claim 1, comprising:
a height of a contact surface between the conductive buffer layer and the first doped region is lower than a height of a central thickness position of the second wire layer, and is higher than a height of a bottom surface of the second wire layer; and
a height of a contact surface between the conductive buffer layer and the third doped region is higher than the height of the central thickness position of the second wire layer and lower than a height of a top surface of the second wire layer.

7. The semiconductor structure of claim 6, wherein a thickness of the conductive buffer layer is less than ⅓ of a thickness of the second wire layer.

8. The semiconductor structure of claim 1, wherein the base comprises a substrate and an isolation layer, the first wire layer is disposed in the substrate, and an isolation layer is disposed on a top surface of the substrate, the first conductive channel layer penetrates the isolation layer and a part of the substrate so that the second doped region is in contact with the first wire layer.

9. The semiconductor structure of claim 1, wherein the base comprises a substrate and an isolation layer, the isolation layer is disposed on a top surface of the substrate, and the first wire layer is disposed on a top surface of the isolation layer.

10. The semiconductor structure of claim 9, further comprising: a first insulating layer disposed around the first wire layer.

11. The semiconductor structure of claim 1, further comprising: a second insulating layer disposed around the second wire layer.

12. The semiconductor structure of claim 1, wherein a top surface of the protective layer is aligned with a top surface of the second conductive channel layer.

13. The semiconductor structure of claim 1, wherein one of the first conductive channel layer and the second conductive channel layer is an N-type conductive channel, and the other is a P-type conductive channel.

14. A method for forming a semiconductor structure, comprising:
providing a base comprising a structure region and a wiring region, wherein the base comprises a substrate, a first wire layer extending in a first direction and an isolation layer;
forming a first sacrificial layer on the base in the structure region, and forming a peripheral insulating structure on the base in the wiring region;
patterning the first sacrificial layer to form a first channel penetrating through the first sacrificial layer;

forming a second wire layer, which fills the first channel and is partially disposed on the first sacrificial layer, extends into the peripheral insulating structure of the wiring region, and extends in a second direction;

sequentially forming a second sacrificial layer and a protective layer on the base in the structure region;

patterning the second sacrificial layer to form a second channel penetrating through the second sacrificial layer, and projections of the first channel and the second channel on the base overlap with each other;

forming a second conductive channel layer filling the second channel;

patterning a part of the protective layer to expose the second sacrificial layer, and removing the second sacrificial layer and the first sacrificial layer; and forming a gate structure which fills a gap between a plane where the first wire layer is disposed and a plane where the second wire layer.

15. The method for forming a semiconductor structure of claim 14, wherein providing the base comprising the structure region and the wiring region comprises: providing a substrate comprising the structure region and the wiring region, forming an isolation layer on the substrate in the structure region, and forming the first wire layer on the isolation layer.

16. The method for forming a semiconductor structure of claim 14, wherein providing the base comprising the structure region and the wiring region comprises: providing a substrate comprising the structure region and the wiring region, forming the first wire layer by doping the substrate in the structure region, and forming the isolation layer on the substrate in the structure region.

17. A method for forming a semiconductor structure, comprising:

providing a base comprising a structure region and a wiring region, wherein the base comprises a substrate, a first wire layer extending in a first direction and an isolation layer;

forming a first sacrificial layer on the base in the structure region, and forming a peripheral insulating structure on the base in the wiring region;

forming a second wire layer which extends into the peripheral insulating structure of the wiring region and extends in a second direction on the first sacrificial layer;

sequentially forming a second sacrificial layer and a protective layer on the base in the structure region;

patterning the protective layer, the second sacrificial layer and the first sacrificial layer to form an opening, and filling the opening to form a conductive channel structure;

patterning a part of the protective layer to expose the second sacrificial layer, and removing the second sacrificial layer and the first sacrificial layer; and forming a gate structure which fills a gap between a plane where the first wire layer is disposed and a plane where the second wire layer.

18. The method for forming a semiconductor structure of claim 17, wherein providing the base comprising the structure region and the wiring region comprises: providing a substrate comprising the structure region and the wiring region, forming an isolation layer on the substrate in the structure region, and forming the first wire layer on the isolation layer.

19. The method for forming a semiconductor structure of claim 17, wherein providing the base comprising the structure region and the wiring region comprises: providing a substrate comprising the structure region and the wiring region, forming the first wire layer by doping the substrate in the structure region, and forming the isolation layer on the substrate in the structure region.

* * * * *